(12) United States Patent
Horino et al.

(10) Patent No.: US 11,714,124 B2
(45) Date of Patent: Aug. 1, 2023

(54) ELECTRONIC COMPONENT HANDLING APPARATUS AND ELECTRONIC COMPONENT TESTING APPARATUS

(71) Applicant: ADVANTEST Corporation, Tokyo (JP)

(72) Inventors: Hiromitsu Horino, Tokyo (JP); Yoshitaka Takeuchi, Tokyo (JP); Yoshinori Arai, Tokyo (JP); Hiroyuki Kikuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/358,414

(22) Filed: Jun. 25, 2021

(65) Prior Publication Data

US 2022/0026486 A1 Jan. 27, 2022

(30) Foreign Application Priority Data

Jul. 21, 2020 (JP) ................................. 2020-124724

(51) Int. Cl.
*G01R 31/28* (2006.01)

(52) U.S. Cl.
CPC ..... *G01R 31/2893* (2013.01); *G01R 31/2887* (2013.01)

(58) Field of Classification Search
CPC ................ G01R 31/26; G01R 31/2862; G01R 31/2863; G01R 31/2867; G01R 31/2868;

(Continued)

(56) References Cited

U.S. PATENT DOCUMENTS

| | | | | |
|---|---|---|---|---|
| 2008/0042667 A1* | 2/2008 | Yamashita | ....... | G01R 31/31905 324/750.16 |
| 2010/0147088 A1* | 6/2010 | Ito | ..................... | G01R 31/2893 73/864.81 |

(Continued)

FOREIGN PATENT DOCUMENTS

| JP | H09-152466 A | 6/1997 |
|---|---|---|
| JP | 2014006097 A | 1/2014 |

(Continued)

OTHER PUBLICATIONS

Office Action issued in corresponding Taiwanese Patent Application No. 110116891, dated Nov. 8, 2022 (5 pages).

(Continued)

*Primary Examiner* — Jermele M Hollington
*Assistant Examiner* — Courtney G McDonnough
(74) *Attorney, Agent, or Firm* — Osha Bergman Watanabe & Burton LLP

(57) ABSTRACT

An electronic component handling apparatus handles a device under test (DUT). The electronic component handling apparatus includes: transfer units that each include a DUT transfer part that mounts the DUT on a first tray and removes the DUT from the first tray; contact units that each press the DUT mounted on the first tray against a socket disposed on a test head connected to a tester; and a tray transporter that transports the first tray between the contact units and the transfer units. Either or both of (i) at least one of the contact units and (ii) at least one of the transfer units are removably disposed on the electronic component handling apparatus.

18 Claims, 13 Drawing Sheets

(58) Field of Classification Search
CPC ............ G01R 31/2874; G01R 31/2887; G01R 31/2893
USPC .................................................. 324/750.03
See application file for complete search history.

(56) References Cited

U.S. PATENT DOCUMENTS

| | | |
|---|---|---|
| 2013/0168203 A1 | 7/2013 | Nakajima et al. |
| 2015/0203300 A1 | 7/2015 | Nakajima et al. |
| 2016/0370424 A1* | 12/2016 | Matsumoto ........ G01R 31/2867 |

FOREIGN PATENT DOCUMENTS

| | | |
|---|---|---|
| KR | 10-2003-0029266 A | 4/2003 |
| KR | 100765463 B1 | 10/2007 |
| KR | 10-2010-0000270 A | 1/2010 |
| KR | 10-2013-0115575 A | 10/2013 |
| TW | 201516430 A | 5/2015 |

OTHER PUBLICATIONS

Office Action issued in the counterpart Korean Patent Application No. 10-2021-0073651 dated Apr. 27, 2023 (13 pages).

* cited by examiner

ELECTRONIC COMPONENT HANDLING APPARATUS AND ELECTRONIC COMPONENT TESTING APPARATUS

CROSS-REFERENCE TO RELATED APPLICATIONS

The present application claims priority from Japanese Patent Application No. 2020-124724 filed on Jul. 21, 2020, the contents of which are incorporated herein by reference in their entirety.

BACKGROUND

Technical Field

The present invention relates to an electronic component handling apparatus and an electronic component testing apparatus that are used in the test of the electronic component under test (DUT: device under test) such as a semiconductor integrated circuit device.

DESCRIPTION OF THE RELATED ART

The electronic component handling device used for the DUT test includes a loader part, a chamber part, and an unloader part (see, for example, Patent Document 1). The loader part transfers the untested DUT from the customer tray to the test tray and feeds the test tray to the chamber unit. The chamber part tests the DUT in a state where the DUT is mounted on the test tray by applying a predetermined thermal stress to the DUT and pressing the DUT to a socket disposed on the test head. The unloader part transfers the tested DUT from the test tray to the customer tray while classifying the tested DUT according to the test result.

Patent Document

Patent Document 1: JP 2014-006097 A

The above-mentioned electronic component handling apparatus has specifications that comprehensively satisfy many needs in the market. Further, since the above-mentioned electronic component handling apparatus is composed of a single frame, a major modification may be required to change the specifications. For this reason, the specification of the electronic component handling apparatus becomes over-specification with respect to the requirements of individual users and the cost of the electronic component handling apparatus is increased for optimization of the specification.

SUMMARY

One or more embodiments of the present invention provide an electronic component handling apparatus capable of optimizing the specifications at a low cost with respect to the user's requirements, and an electronic component test apparatus having the same.

[1] An electronic component handling apparatus according to one or more embodiments of the present invention is an electronic component handling apparatus that handles a DUT, the electronic component handling apparatus comprising: contact units each of which presses the DUT to a socket disposed on a test head connected to a tester in a state where the DUT is mounted on a first tray; transfer units each of which includes a DUT transfer part that mounts the DUT on the first tray or take out (remove) the DUT from the first tray; and a tray transport unit (i.e., tray transporter) that transports the first tray between the contact units and the transfer units, and the electronic component handling apparatus is configured so that at least one of the contact unit and the transfer unit is added to or removed (subtracted) from the electronic component handling apparatus.

[2] In one or more embodiments, the DUT transfer part may be disposed above the tray transport unit.

[3] In one or more embodiments, the contact units may be arranged along a first direction that is substantially parallel to a horizontal direction, the transfer units may be arranged along the first direction, and the tray transport unit may transport the first tray along the first direction.

[4] In one or more embodiments, the DUT transfer part may include a first tray moving device that delivers and receives the first tray to and from the tray transfer unit in a vertical state.

[5] In one or more embodiments, the first tray moving device may move the first tray along a longitudinal direction of the first tray.

[6] In one or more embodiments, the tray transport unit may include a tray holding device that is capable of holding the first tray in a vertical state.

[7] In one or more embodiments, the DUT transfer part may include a posture changing device that changes a posture of the first tray between a horizontal state and a vertical state.

[8] In one or more embodiments, the posture changing device may change the posture of the first tray by raising or lowering a first side of the first tray while horizontally moving a second side facing the first side in the first tray in a state where the position of the first side is maintained in the horizontal direction.

[9] In one or more embodiments, the transfer unit may include a tray storage part (i.e., tray storage) that stores a second tray, and the DUT transfer part may transfer the DUT between the first tray and the second tray.

[10] In one or more embodiments, the DUT transfer part may be disposed above the tray storage part.

[11] In one or more embodiments, the tray storage part may include: first holding devices that hold the second tray; and a second tray moving device that moves the second tray between the first holding devices.

[12] In one or more embodiments, the transfer units adjacent to each other may include a third tray moving device that is disposed between the tray storage parts and moves the second tray, the operating range of the third tray moving device may vertically overlap both operating ranges of the second tray moving devices of the transfer units adjacent to each other.

[13] In one or more embodiments, the transfer units may include: a loader unit (i.e., loader) that includes a loader part that transfers the untested DUT from a second tray to the first tray; and an unloader unit (i.e., unloader) that includes an unloader part that transfers the tested DUT from the first tray to the second tray.

[14] In one or more embodiments, the number of loader units that is included in the electronic component handling apparatus may be different from the number of unloader units that is included in the electronic component handling apparatus.

[15] In one or more embodiments, each of the contact units may be capable of adjusting a temperature of the DUT independently from other of the contact units and pressing the DUT to a socket disposed on the test head independently from other of the contact units, and the electronic component handling apparatus may be configured so that the contact unit is added to or removed from the electronic component handling apparatus.

[16] In one or more embodiments, the DUT transfer part may transfer the DUT between a first tray and a second tray.

[17] In one or more embodiments, the tray transport unit may transport the first tray in a vertical state.

[18] In one or more embodiments, the tray transport unit may transport the first tray along a direction substantially parallel to a main surface of the first tray.

[19] In one or more embodiments, the tray transport unit may receive and deliver the first tray from and to the transfer unit in a vertical state and may deliver and receive the first tray to and from the contact unit in a vertical state.

[20] In one or more embodiments, the contact units may be arranged along a first direction that is substantially parallel to a horizontal direction, and the tray transport unit may transport the first tray along the first direction in a state where a main surface of the first tray is substantially parallel to the first direction.

[21] In one or more embodiments, the tray transport unit may include: a rail disposed along a first direction that is an arrangement direction of the contact units; and a moving part that is capable of moving on the rail, and the moving part may include a tray holding device that is capable of holding the first tray.

[22] In one or more embodiments, the tray holding device may be capable of holding the first tray in a vertical state.

[23] In one or more embodiments, the tray holding device may move the first tray along the normal direction of the first tray to carry the first tray into and out of the contact unit.

[24] In one or more embodiments, the moving part may include a driving device that moves the tray holding device on the rail.

[25] In one or more embodiments, the driving device may include a rotary motor having a rotary shaft to which a pinion gear is attached, and the tray transport unit may include a rack gear that is disposed in parallel with the rail and that the pinion gear is engaged with.

[26] In one or more embodiments, the contact unit may include: a heat applying section that applies a heat stress to the DUT; a pressing section that presses the DUT to the socket; and a heat removing section that removes the heat stress from the DUT, the heat applying section, the pressing section, and the heat removing section may be arranged along a vertical direction, the heat applying section may be arranged below the pressing section, and the heat removing section may be arranged above the pressing section.

[27] In one or more embodiments, the contact unit may include a fourth tray moving device that moves the first tray from the heat applying section to the pressing section and moves the first tray from the pressing section to the heat removing section.

[28] In one or more embodiments, the fourth tray moving device may move the first tray along a longitudinal direction of the first tray.

[29] In one or more embodiments, the pressing section may include a pressing device that presses the DUT horizontally to the socket in a state where the first tray is in a vertical state, the fourth tray moving device may move the first tray in a vertical state, and the contact unit may include: a fifth tray moving device that moves the first tray in a vertical state along a second direction that is a normal direction of the first tray in the heat applying section; and a sixth tray moving device that moves the first tray in a vertical state along a third direction that is opposed to the second direction in the heat removing section.

[30] In one or more embodiments, the contact unit may include an access section that allows the first tray to be moved in and out of the contact unit, the heat removing section, the access section, and the heat applying section may be arranged along a vertical direction, the heat applying section may be arranged below the access section, the heat removing section may be arranged above the access section, and the tray transport unit may carry the first tray into and out of the contact unit in a vertical state via the access section.

[31] In one or more embodiments, the contact unit may include a seventh tray moving device that moves the first tray from the heat removing section to the access section in a vertical state and moves the first tray from the access section to the heat applying section in a vertical state.

[32] An electronic component testing apparatus according to one or more embodiments of the present invention is an electronic component testing apparatus that tests a DUT, comprising: the above-described electronic component handling apparatus; test heads that are mounted to the contact units; and a tester electrically that is connected to the test heads.

[33] In one or more embodiments, the test heads may be connected to the single tester.

In one or more embodiments, the electronic component handling apparatus is configured so that at least one of the contact unit and the transfer unit is added to or removed from the electronic component handling apparatus. As a result, since it is possible to configure the electronic component handling apparatus by combining units that are optimal for the user's request, it is possible to optimize the specification of the electronic component handling apparatus for the user's request at low cost.

DETAILED DESCRIPTION

Figure 1:
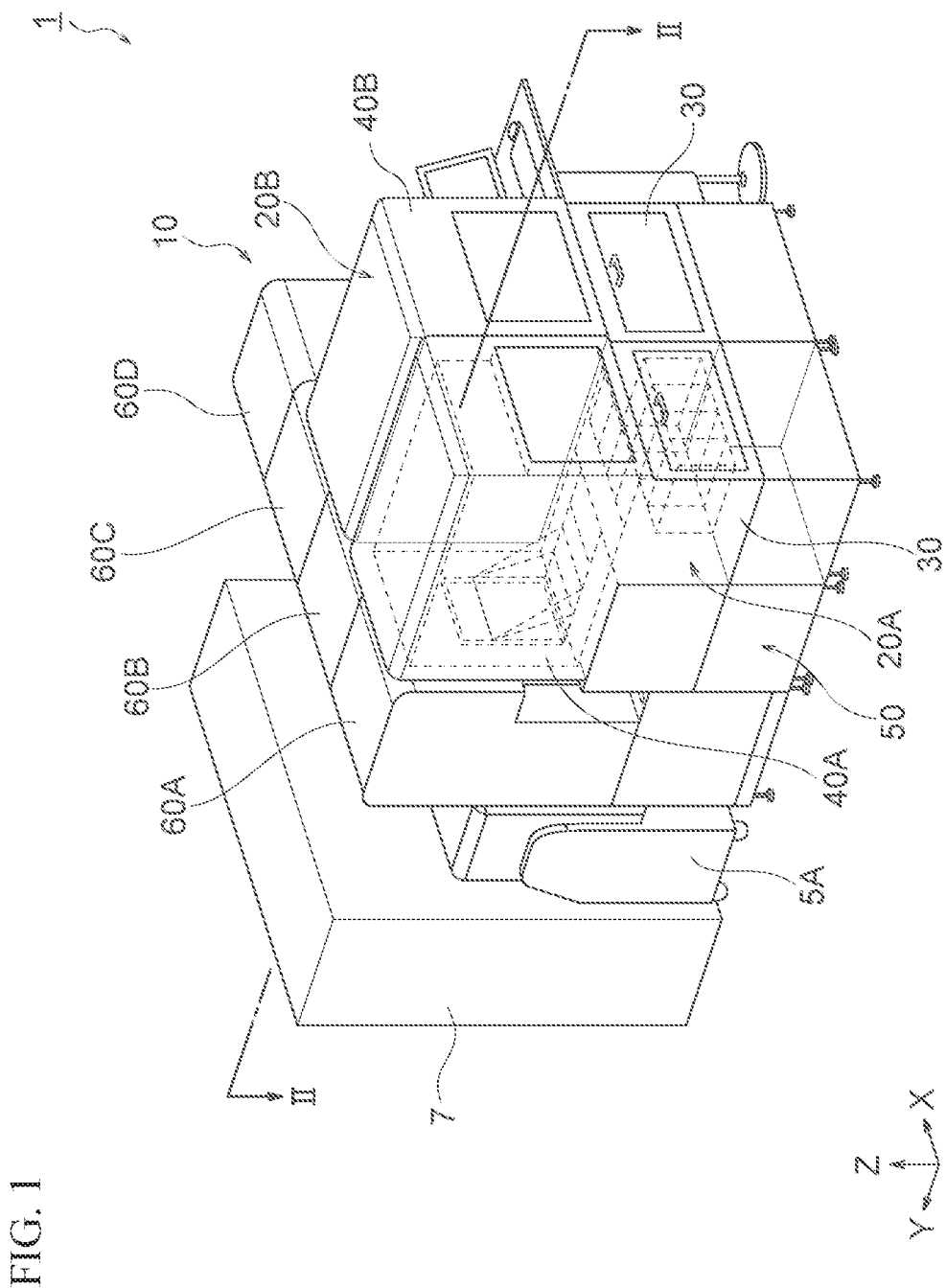
FIG. 1 is a perspective view showing the electronic component testing apparatus in one or more embodiments of the present invention.
Figure 2:
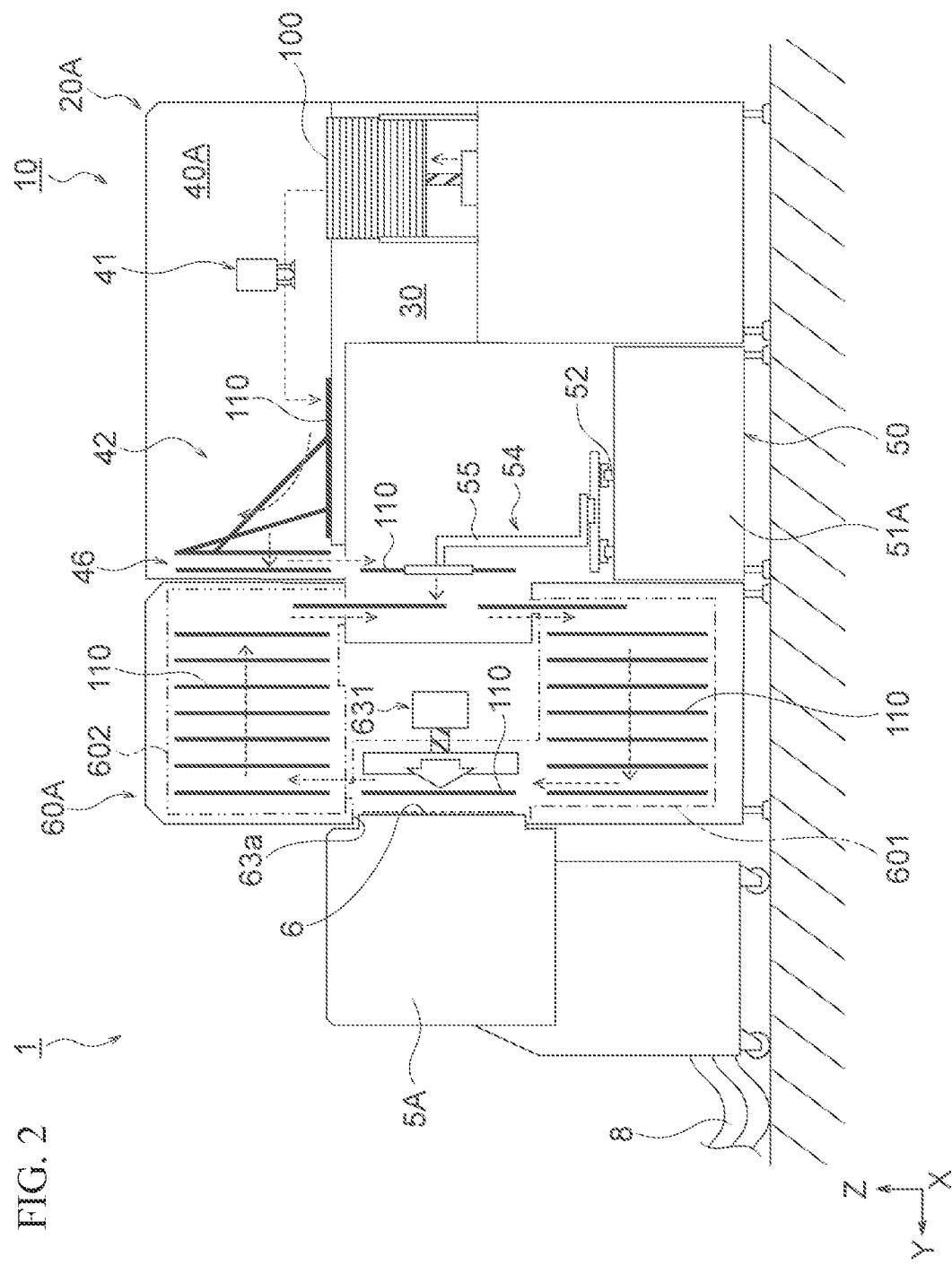
FIG. 2 is a cross-sectional view showing the electronic component testing apparatus in one or more embodiments of the present invention and is a cross-sectional view taken along II-II line of FIG. 1.
Figure 3:
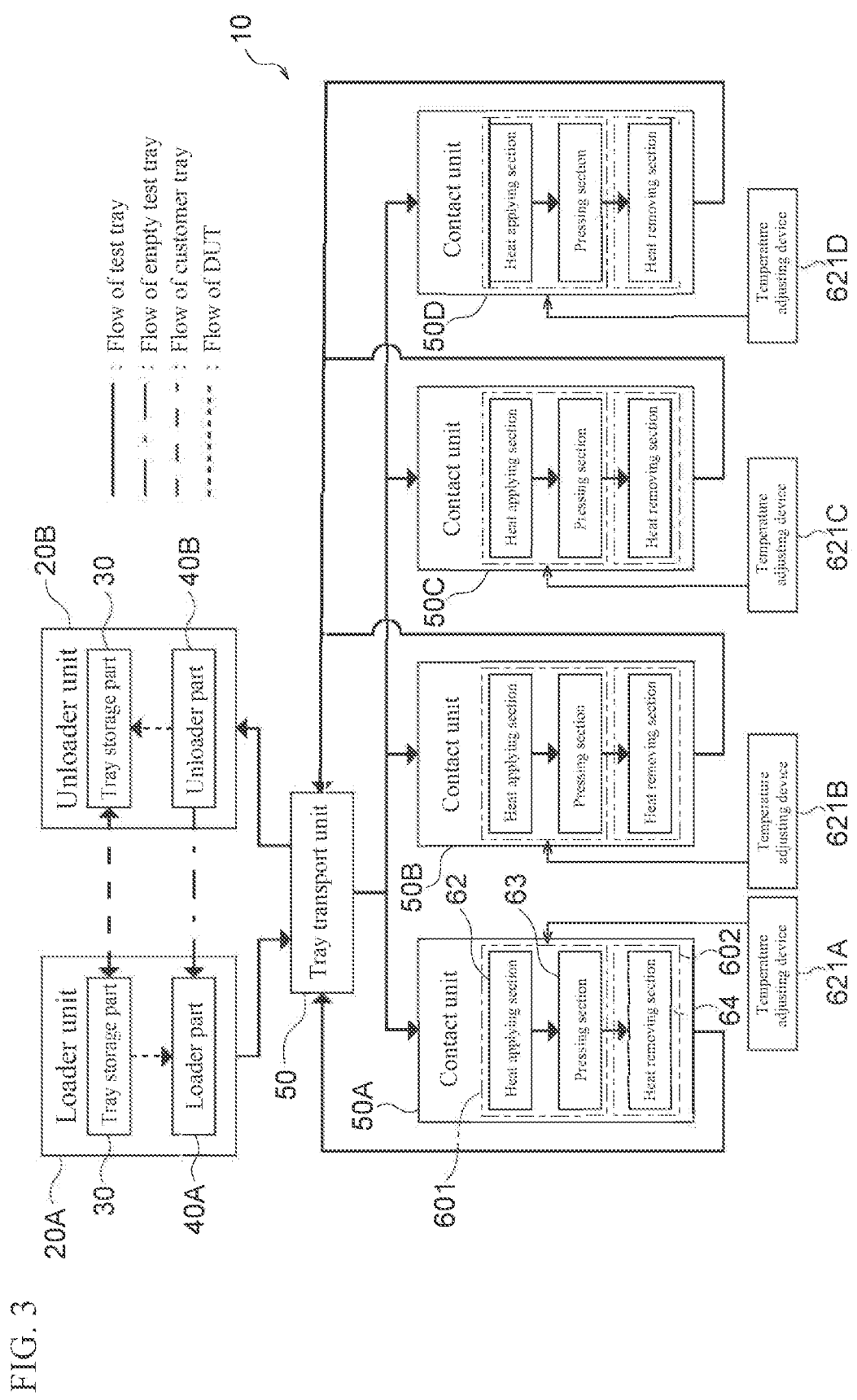
FIG. 3 is a diagram showing a flow of a test tray in the handler in one or more embodiments of the present invention.

Hereinafter, embodiments of the present invention will be described with reference to the drawings. FIG. 1 is a perspective view showing the electronic component testing apparatus in one or more embodiments. FIG. 2 is a cross-sectional view showing the electronic component testing apparatus in one or more embodiments and is a cross-sectional view taken along II-II line of FIG. 1. FIG. 3 is a diagram showing a flow of a test tray in the handler in one or more embodiments.

Electronic component testing apparatus 1 in one or more embodiments is an apparatus that tests the electrical properties of DUT 200 in a state of applying a high-temperature or low-temperature thermal stress to the DUT 200 (or a state of room temperature (normal temperature)) and classifies the DUT 200 according to the test results. As a specific example of the DUT 200 to be tested, a memory device can be exemplified. The DUT 200 to be tested by the electronic component testing apparatus 1 is not particularly limited to the above described as long as it is an electronic component, and it may be, for example, a SoC (System on a chip) or a logic device.

As shown in FIGS. 1 and 2, the electronic component testing apparatus 1 includes four test heads 5A to 5D (see FIGS. 3 and 12A), one tester (main frame) 7, and handler 10. As will be described later, the number of test heads included in the electronic component testing apparatus is not particularly limited to the above described. The electronic component testing apparatus may include a plurality of testers. The handler 10 corresponds to an example of the "electronic component handling apparatus" in one or more embodiments of the present invention.

The test head 5A to 5D has a plurality of sockets 6 to each of which the DUT 200 is electrically connected at the time of testing. The test heads 5A to 5D are respectively mounted to the contact units 60A to 60D of the handler 10 with the sockets 6 facing horizontally. Each of the test heads 5A to 5D enters the first chamber 601 through an opening 63a formed in the contact unit 60A to 60D so that the sockets 6 face the pressing device 631 of the contact unit 60A to 60D.

In one or more embodiments, all of the test head 5A to 5D are respectively connected to the same one tester 7 through the cable 8. The tester 7 performs testing of the DUT 200 by sending a test signal to the DUT 200 through the test head 5A to 5D in a state where the pressing device 631 of the contact unit 60A to 60D presses the DUT 200 to the socket 6.

In one or more embodiments, the total number of sockets 6 included in the four test heads 5A to 5D is the same as the number of DUTs that can be simultaneously tested by one tester 7. Although not particularly limited, for example, when the simultaneous measurement number of the tester 7 is 1024, the number of sockets 6 included in each test head 5A to 5D is 256. The number of sockets included in each of test heads may be different from each other.

The handler 10 in one or more embodiments is an apparatus that transfers the DUT 200 from a customer tray (or second tray) 100 to a test tray (or first tray) 110 and presses the DUT 200 to the socket 6 of the test head 5A to 5D in a state where the DUT 200 is mounted on the test tray 110. The handler 10 includes two transfer unit 20A and 20B (a loader unit 20A and an unloader unit 20B), a tray transport unit 50, and four contact unit 60A to 60D, as shown in FIGS. 1 to 3.

Here, the customer tray 100 is a tray for transporting a plurality of DUTs 200 between a process using the handler 10 and other process. The customer tray 100 is a plate-shaped tray made of a resin material or the like. The customer tray 100 has a plurality of pockets arranged in a matrix, and each pocket has a concave shape capable of accommodating the DUT 200. The untested DUT 200 is carried into the handler 10 from the preceding process while being mounted on the customer tray 100. The tested DUT 200 is carried out from the handler 10 to the post-process while being mounted on the customer tray 100.

On the other hand, the test tray 110 is a tray that is circularly transported in the handler 10 while accommodating a plurality of DUTs 200. The test tray 110 includes a frame and a plurality of inserts 111 (refer to FIG. 6) movably held by the frame. The plurality of inserts 111 are arranged in a matrix so as to correspond to the arrangement of the sockets 6 of the test head 5A to 5D, and the plurality of inserts 111 can respectively accommodate the DUTs 200. The testing of DUTs 200 is performed by pressing the DUTs 200 to the sockets 6 by the pressing device 631 in a state where the DUTs 200 are accommodated in the inserts 111 of the test tray 110. At this time, since the inserts 111 are movably held by the frame, the plurality of DUTs 200 can be positioned independently from each other with respect to the sockets 6.

The loader unit 20A of the handler 10 transfers the untested DUT 200 from the customer tray 100 to the test tray 110 and supplies the test tray 110 to the tray transport unit 50. The tray transport unit 50 transports the test tray 110 to any of the contact units 60A to 60D.

Then, the contact unit 60A to 60D presses the DUT 200 to the socket 6 while being mounted on the test tray 110 after applying a predetermined thermal stress of high temperature or low temperature to the DUT 200, and then, the tester 7 executes a test of the DUT 200.

At this time, as described above, since the test heads 5A to 5D are individually mounted to the four contact units 60A to 60D, the contact unit (e.g., the contact unit 60A) can press the DUTs 200 to the sockets 6 independently from the other of the contact units (e.g., the contact units 60B to 60D).

Further, in one or more embodiments, as shown in FIG. 3, since the temperature adjusting devices 621A to 621D are individually connected to the four contact units 60A to 60D, the contact unit (e.g., the contact unit 60A) can adjust the temperature of the DUTs 200 independently from the other of the contact units (e.g., the contact units 60B to 60D).

Therefore, in one or more embodiments, the contact unit (e.g., the contact unit 60A) can execute the test independently from the other contact units (e.g., the contact units 60B to 60D). The four contact units 60A to 60D may perform tests of the same content or may perform tests of different content from each other. The four contact units 60A to 60D may perform tests under the same temperature condition or may perform tests under different temperature conditions from each other.

The test tray 110 on which the tested DUTs 200 are mounted is discharged from the contact unit 60A to 60D to the tray transport unit 50, and the tray transport unit 50 transports the test tray 110 to the unloader unit 20B. The unloader unit 20B transfers the tested DUT 200 from the test tray 110 to the customer tray 100 while classifying the tested DUT 200 according to the test result.

The tray transport unit 50 may transport the test tray 110 on which the tested DUTs 200 are mounted from the contact unit (e.g., the contact unit 60A) to another contact unit (e.g., one of the contact units 60B to 60D). Thus, a plurality of types of tests can be performed on the same DUT 200 by the same handler 10.

In one or more embodiments, the device frames of the four contact units 60A to 60D are independently separated from each other. The four contact units 60A to 60D are arranged along the X-direction. Similarly, the device frames of the two transfer units 20A and 20B are also independently separated from each other. The two transfer units 20A and 20B are also arranged along the X-direction. The X direction corresponds to an example of the "first direction" in one or more embodiments of the present invention.

The device frames of the tray transport unit 50 are also separated independently from the transfer units 20A and 20B and the contact units 60A to 60D and are arranged along the X-direction. The tray transport unit 50 is disposed between the two transfer units 20A and 20B and the four contact units 60A to 60D. Then, these units 20A and 20B, 50 and 60A to 60D can be easily connected and separated by a coupler (connector) not shown in particular.

Therefore, the handler 10 of one or more embodiments is configured to be capable of increasing or decreasing the number of units arbitrarily in accordance with the simultaneous measurement number, the test time, and the like. Accordingly, as will be described later, the number of contact units included in the handler 10 is not particularly limited to the above described and can be set according to the number of test heads and the like. The number of loader unit 20A and unloader unit 20B included in the handler 10 is not particularly limited to the above described and can be arbitrarily set according to the number of sockets on the test head, the test time, and the like.

Hereinafter, the configurations of the transfer units 20A and 20B, the tray transport unit 50, and the contact units 60A to 60D that constitute the handler 10 will be described in detail.

Figure 4:
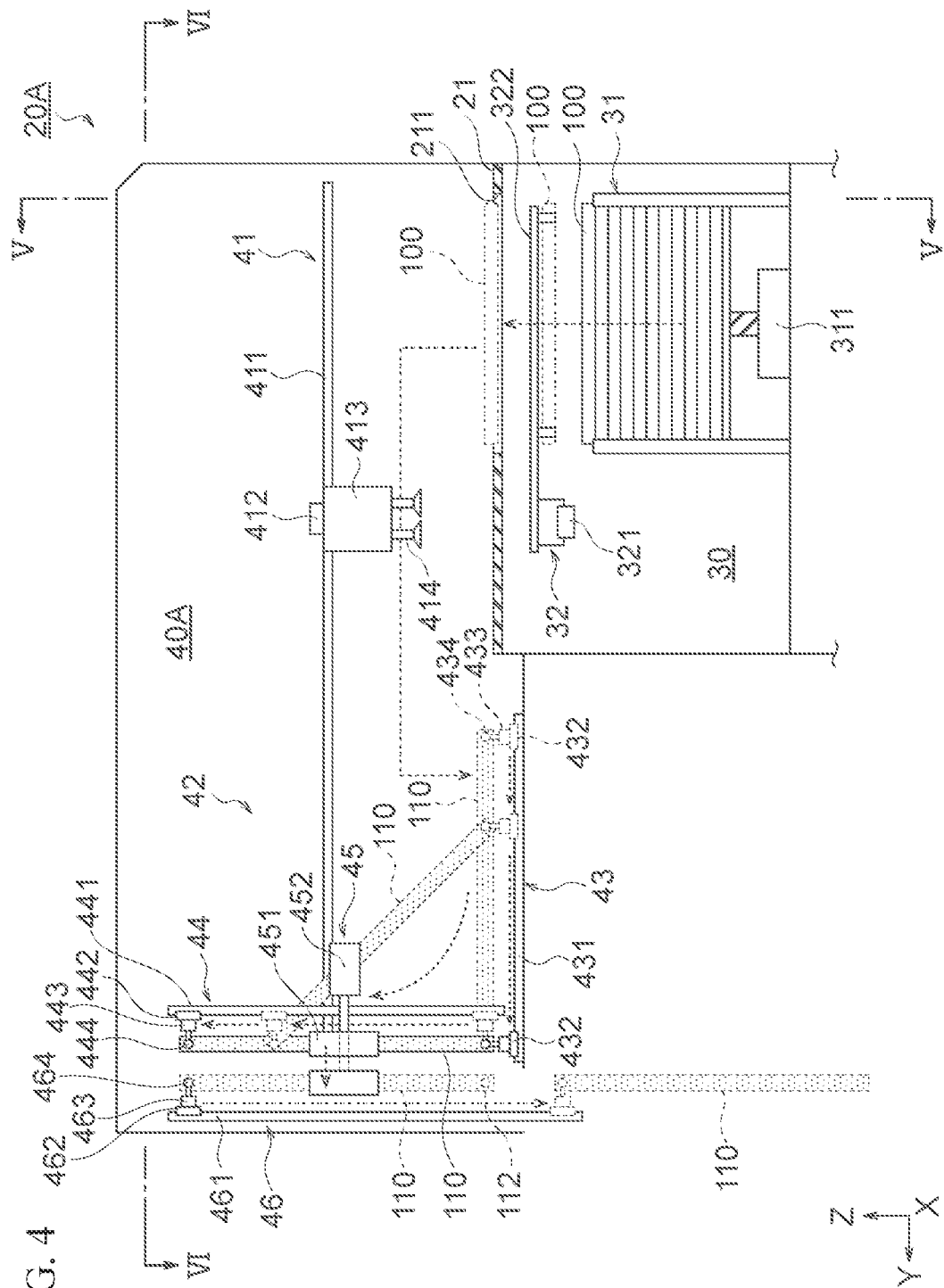
FIG. 4 is a cross-sectional view showing the internal structure of the loader unit in one or more embodiments of the present invention.
Figure 5:
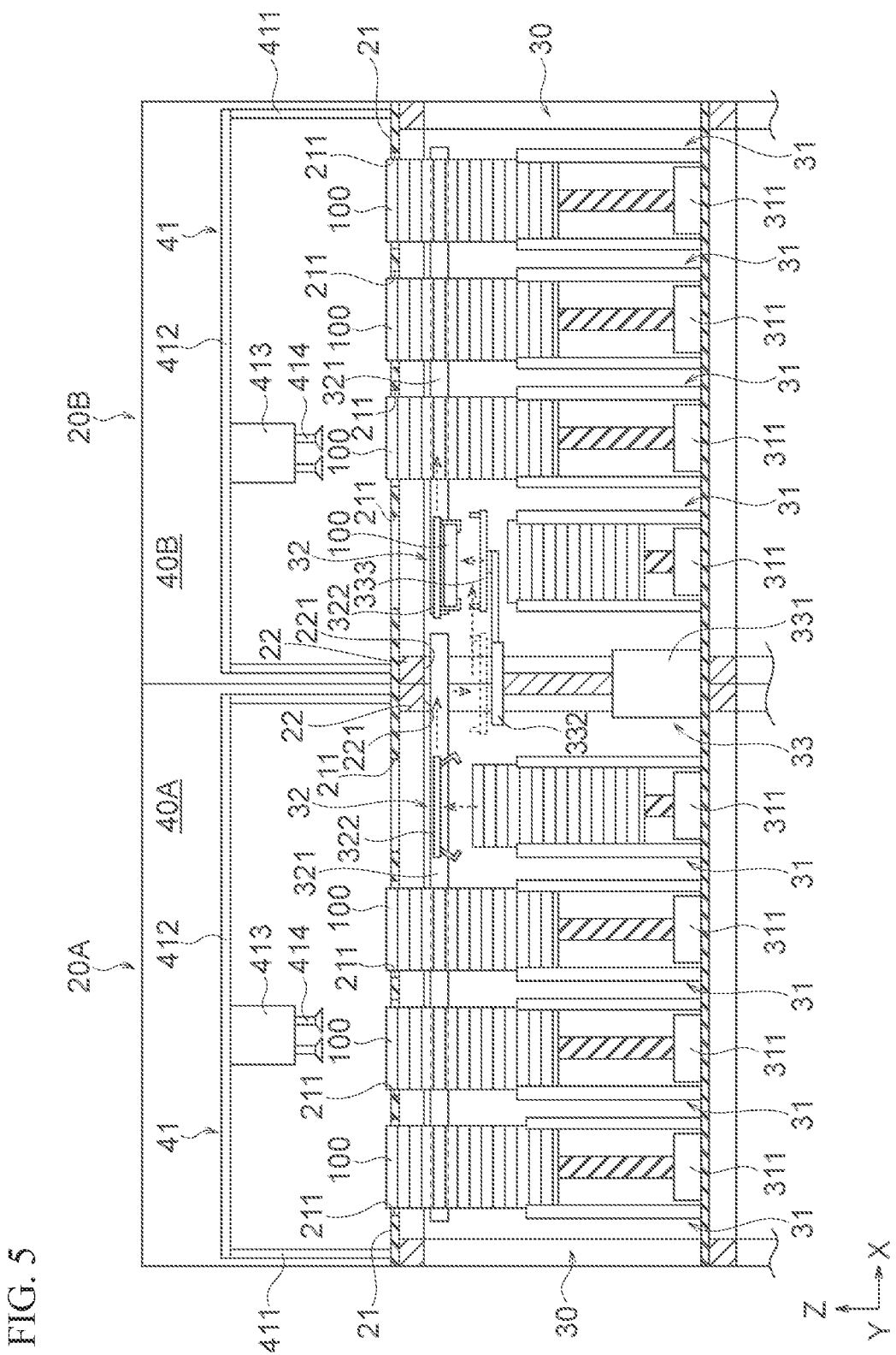
FIG. 5 is a front view showing the internal structure of the loader unit and the unloader unit in one or more embodiments of the present invention and is a front view of the tray storage part seen along the V-V line of FIG. 4.
Figure 6:
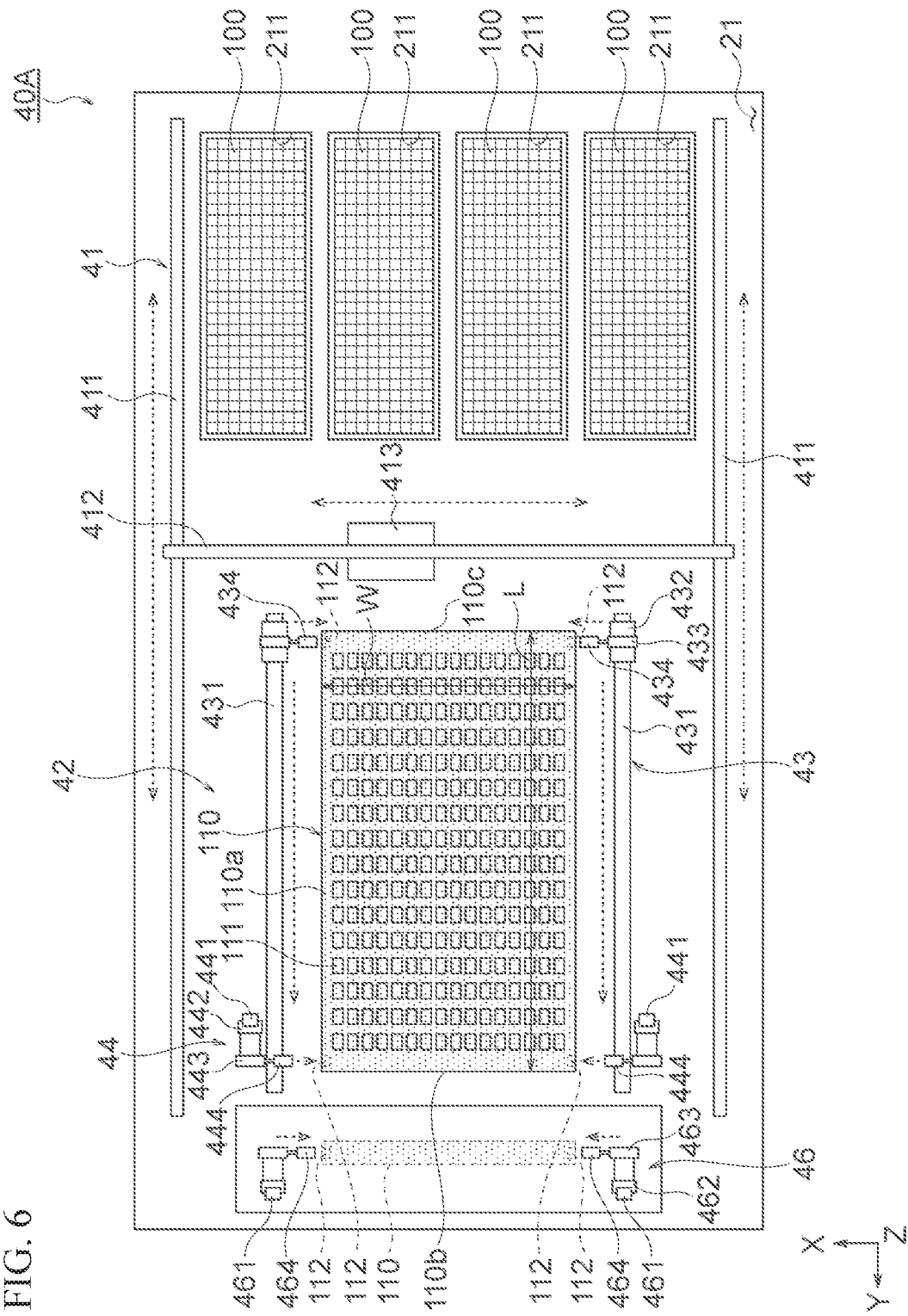
FIG. 6 is a plan view showing the inner structure of the loader unit in one or more embodiments of the present invention and is a plan view of the loader part seen along VI-VI line of FIG. 4.
Figure 7:
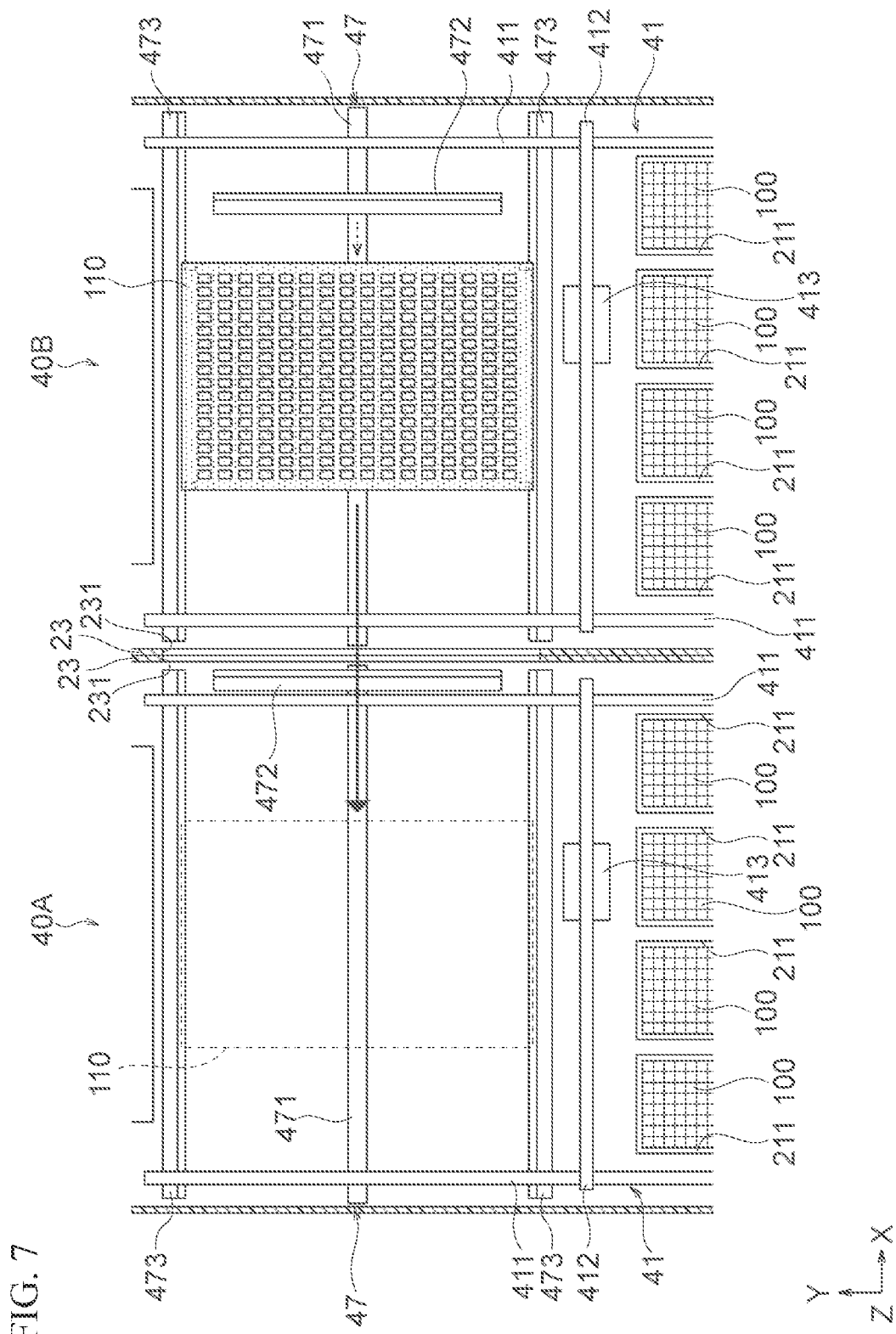
FIG. 7 is a plan view showing a tray return device that returns empty test trays from the unloader unit to the loader unit in one or more embodiments of the present invention.

FIG. 4 is a cross-sectional view showing the internal structure of the loader unit in one or more embodiments. FIG. 5 is a front view showing the internal structure of the loader unit and the unloader unit in one or more embodiments and is a front view of the tray storage part seen along the V-V line of FIG. 4. FIG. 6 is a plan view showing the inner structure of the loader unit in one or more embodiments and is a plan view of the loader part seen along VI-VI line of FIG. 4. FIG. 7 is a plan view showing a tray return device that returns empty test trays from the unloader unit to the loader unit in one or more embodiments.

As described above, the loader unit 20A is a unit that transfers the untested DUTs 200 from the customer tray 100 to the test tray 110 and supplies the test tray 110 to the tray transport unit 50. As shown in FIGS. 4 to 6, the loader unit 20A includes a tray storage part 30 that stores a plurality of customer trays 100, and a DUT transfer part (a loader part) 40A that transfers the DUTs 200 between the trays 100 and 110.

On the other hand, the unloader unit 20B is a unit that receives the test tray 110 that the tested DUTs 200 are mounted on from the tray transport unit 50 and transfers the DUTs 200 from the test tray 110 to the customer tray 100.

The unloader unit 20B also includes a tray storage part 30 that stores a plurality of customer trays 100, and a DUT transfer part (an unloader part) 40B that transfers DUT200 between the trays 110 and 100.

Since the loader unit 20A and the unloader unit 20B basically have the same construction, the configuration of the loader unit 20A will be described in detail below. The configuration of the unloader unit 20B will be described only with respect to the configuration different from that of the loader unit 20A.

The tray storage part 30 is a part of the loader unit 20A that stores a plurality of customer trays 100 and supplies the customer trays 100 to the loader part 40A. As shown in FIGS. 4 and 5, the tray storage part 30 includes four stockers 31 and a tray transfer arm 32. The tray transfer arm 32 corresponds to the "second tray moving device" in one or more embodiments of the present invention.

All of the four stockers 31 have the same structure, and each of the four stockers 31 has a box-like shape capable of accommodating a plurality of customer trays 100 stacked on each other. An elevator 311 for raising and lowering the stack of customer trays 100 is disposed at the bottom of each stocker 31. A window portion (or window) 211 is disposed above each stocker 31. The window portion 211 is formed on a board (or substrate) 21 that partitions the tray storage part 30 and the loader part 40A in the loader unit 20A. By raising the customer tray 100 stored in the stocker 31 by the elevator 311, the customer tray 100 can be positioned in the loader part 40A via the window portions 211. The elevator 311 corresponds to an example of the "first holding device" in one or more embodiments of the present invention.

In one or more embodiments, the four stockers 31 of the tray storage part 30 of the loader unit 20A store the customer tray 100 containing the untested DUTs 200. On the other hand, the four stockers 31 of the tray storage part 30 of the unloader unit 20B store the customer tray 100 containing the tested DUTs 200.

An empty customer tray 100 on which no DUT 200 is mounted may be stored in a part of the stockers 31 of the loader unit 20A, or an empty customer tray 100 on which no DUT 200 is mounted may be stored in a part of the stockers 31 of the unloader unit 20B. The customer tray 100 on which the tested DUTs 200 are mounted may be stored in a part of the stockers 31 of the loader unit 20A by using a tray return arm 33 that will be described later.

In the handler 10, the stocker 31 storing a plurality of customer trays 100 on which the untested DUTs 200 are mounted is set in the tray storage part 30 of the loader unit 20A, thereby the untested DUTs 200 are carried into the handler 10 from the previous process. Further, in the handler 10, the stocker 31 storing the plurality of customer trays 100 on which the tested DUTs 200 are mounted are taken out from the tray storage part 30 of the unloader unit 20B, thereby the tested DUTs 200 are carried out from the handler 10 to the next process.

The tray transfer arm 32 is a device that moves the customer tray 100 between the four stockers 31 of the tray storage part 30 and includes a rail 321 and a tray holding part 322. The rail 321 is disposed along the X direction. The tray holding part 322 has a holding claw that is capable of holding the customer tray 100 and can move along the X direction on the rail 321.

In one or more embodiments, as described above, although the device frames 22 of the loader unit 20A and the unloader unit 20B are independently separated from each other, the spaces of the tray storage parts 30 of the loader unit 20A and the unloader unit 20B are connected to each other through the openings 221 of the device frames 22. Further, although each of the tray storage parts 30 of both the loader unit 20A and the unloader unit 20B includes the tray transfer arm 32 described above, the rail 321 of the tray transfer arm 32 of the loader unit 20A is longer than the rail 321 of the tray transfer arm 32 of the unloader unit 20B. Then, the rail 321 of the tray transfer arm 32 of the loader unit 20A enters the tray storage part 30 of the unloader unit 20B through the openings 221 of the device frames 22, the end of the rail 321 is located in the tray storage part 30 of the unloader unit 20B.

In one or more embodiments, the loader unit 20A and the unloader unit 20B include a tray return arm 33. The tray return arm 33 is a device that moves the custom tray 100 between the tray storage parts 30 of the loader unit 20A and the unloader unit 20B. The tray return arm 33 is disposed at the openings 221 of the device frames 22 so as to straddle the tray storage parts 30 of the loader unit 20A and the unloader unit 20B.

The tray return arm 33 includes a lifting device 331, an expandable arm 332 and a tray holding part 333. The lifting device 331 is a device that raises and lows the expandable arm 332. The expandable arm 332 is a device that is capable of expanding and contracting along the X direction and is capable of moving the tray holding part 333 in the X direction, and the tray holding part 333 is capable of holding the customer tray 100. In the vertical direction (Z direction), the operating range of the tray return arm 33 overlaps the operating range of the tray transfer arm 32 of the loader unit 20A and also overlaps the operating range of the tray transfer arm 32 of the unloader unit 20B. The tray return arm 33 corresponds to an example of the "third tray moving device" in one or more embodiments of the present invention.

For example, in the loader unit 20A, in order to feed the customer tray 100 stored in the stocker 31 to the loader part 40A, the elevator 311 rises to position the customer tray 100 in the window portions 211. Then, when all of the DUTs 200 are transferred to the test tray 110 by the pick and place device 41 of the loader part 40A and the customer tray 100 becomes empty, the elevator 311 descends and the tray transfer arm 32 holds the empty customer tray 100.

Then, the tray holding part 322 of the tray transfer arm 32 moves to above the tray return arm 33, and the tray return arm 33 receives the customer tray 100 from the tray transfer arm 32. Next, the tray return arm 33 moves below the tray transfer arm 32 of the unloader unit 20B, and the customer tray 100 is transferred from the tray return arm 33 to the tray transfer arm 32. By the above operation, the empty customer tray 100 is returned from the loader unit 20A to the unloader unit 20B.

The loader part 40A is a part of the loader unit 20A that transfers the DUT 200 from the customer tray 100 supplied from the tray storage part 30 to the test tray 110 and supplies the test tray 110 to the tray transport unit 50. The loader part 40A is disposed above the tray storage part 30 and is disposed above the tray transport unit 50. By employing such an arrangement, it is possible to reduce the area occupied by the handler 10.

As shown in FIGS. 4 and 6, the loader part 40A includes a pick-and-place device 41, a posture changing device 42, and a vertical transport device 46. The vertical transport device 46 corresponds to an example of the "first tray moving device" in one or more embodiments of the present invention.

The pick-and-place device 41 includes a pair of Y-direction rails 411, an X-direction rail 412, and a movable head 413. The Y-direction rails 411 are disposed along the Y-direction on the board 21 that partitions the tray storage part 30 and the loader part 40A in the loader unit 20A. The X-direction rail 412 is capable of moving along the Y-direction on the Y-direction rails 411. The movable head 413 is capable of moving along the X direction on the X direction rail 412. The movable head 413 has a plurality of suction portions 414 each of which is capable of suction-holding the DUT 200.

The operating range of the pick-and-place device 41 includes four window portions 211 formed on the board 21 and overlaps a part of the operating range of the posture changing device 42. Therefore, the pick-and-place device 41 can transfer the DUT 200 from the customer tray 100 located in the window portions 211 to the test tray 110 located in the operation area of the posture changing device 42. Incidentally, a buffer for temporarily placing DUT200 or a prescier for positioning DUT200 may be disposed between the window portion 211 and the posture changing device 42.

The posture changing device 42 is a device that changes the posture of the test tray 110 between a horizontal state and a vertical state. As shown in FIGS. 4 and 6, the posture changing device 42 includes a horizontal sliding device 43, a vertical sliding device 44, and a horizontal moving device 45. The configuration of the posture changing device 42 is not particularly limited as long as it can change the posture of the test tray 110 between a horizontal state and a vertical state. In order to facilitate understanding of the sliding devices 43 and 44, the horizontal moving device 45 is not shown in FIG. 6.

Here, concerning the posture of the test tray 110, the "horizontal state" is a state in which the main surface 110a of the test tray 110 is substantially parallel to the horizontal direction (XY direction). On the other hand, the "vertical state" is a state in which the main surface 110a of the test tray 110 is substantially parallel to the vertical direction (Z direction).

The horizontal sliding device 43 includes a pair of horizontal rails 431, a slider 432, air cylinders 433, and insertion pieces 434.

The pair of horizontal rails 431 are disposed along the Y direction and are arranged substantially parallel to each other at an interval wider than the width of the test tray 110. Each of the sliders 432 is slidably provided on the horizontal rail 431 and is capable of moving along the Y direction on the horizontal rail 431 by an actuator such as an air cylinder (not shown in particular).

The air cylinder 433 is provided on the slider 432, and a cylindrical insertion piece 434 is attached to the distal end of the movable shaft of the air cylinder 433. The air cylinders 433 are provided on the slider 432 so that the insertion pieces 434 face each other. The air cylinder 433 is capable of moving the insertion piece 434 forward and backward along the X direction so that the insertion pieces 434 approach to and separate from each other by driving of the air cylinders 433. Instead of the air cylinder 433, other actuators such as a motor and a ball screw mechanism may be used.

The vertical sliding device 44 also includes a pair of vertical rails 441, sliders 442, air cylinders 443, and insertion pieces 444.

The pair of vertical rails 441 are disposed along the Z direction and are substantially parallel to each other at an interval wider than the width of the test tray 110. The vertical rails 441 are disposed near one end of the horizontal rails 431 described above (left end in FIG. 4). Each of the sliders 442 is slidably provided on the vertical rail 441 and is capable of moving along the Z direction on the vertical rail 441 by an actuator such as an air cylinder (not shown) in particular.

The air cylinder 443 is provided on the slider 442, and a cylindrical insertion piece 444 is attached to the distal end of the movable shaft of the air cylinder 443. The air cylinders 443 are provided on the slider 442 so that the insertion pieces 444 face each other. The air cylinder 443 is capable of moving the insertion piece 444 forward and backward along the X direction so that the insertion pieces 444 approach to and separate from each other by driving of the air cylinders 443. Instead of the air cylinder 443, other actuators such as a motor and a ball screw mechanism may be used.

Here, two recesses (or concave portions) 112 are formed on one side surface along the longitudinal direction of the test tray 110 of one or more embodiments, and two recesses 112 are also formed on the other side surface. The four recesses 112 are disposed at four corners of the test tray 110. The pair of recesses 112 are disposed at corners near the first side 110b of the test tray 110 and are opposed to each other. On the other hand, the other pair of recesses 112 are disposed at corners near the second side 110c of the test tray and are opposed to each other. The first side 110b is one short side among the sides constituting the test tray 110, and the second side 110c is the other short side among the sides constituting the test tray 110. Each recess 112 is recessed toward the inside of the test tray 110 and has a cylindrical shape with an inner diameter into which the insertion piece 434 and 444 described above can be inserted.

The posture changing operation of the test tray 110 using the slide devices 43 and 44 is performed as follows.

That is, the horizontal sliding device 43 positions the slider 432 at the right end of horizontal rail 431 in FIG. 4 and moves the movable axis of the air cylinder 433 forward with respect to the test tray 110 in the horizontal state, thereby the insertion pieces 434 are inserted into the pair of recesses 112 of the second side 110c side of the test tray 110. Similarly, the vertical sliding device 44 positions the slider 442 at the lower end of the vertical rail 441 and moves the movable axis of the air cylinder 443 forward with respect to the test tray 110 in the horizontal state, thereby the insertion pieces 444 are inserted into the pair of recesses 112 of the first side 110b side of the test tray 110.

Next, the horizontal sliding device 43 moves the slider 432 toward the left end of the horizontal rail 431 of FIG. 4 and the vertical sliding device 44 moves the slider 442 toward the upper end of the vertical rail 441 at the same time. At this time, each of the insertion pieces 434 and 444 has a cylindrical shape and relatively rotatable in the recess 112 of the test tray 110. Therefore, in a state where the position of the first side 110b of the test tray 110 is maintained (fixed) in the horizontal direction and the position of the second side 110c of the test tray 110 is maintained (fixed) in the vertical direction, the posture of the test tray 110 can be changed from the horizontal state to the vertical state by horizontally moving the second side 110c while the first side 110b is raised.

It is possible to change the posture of the test tray 110 in a small space by using such a sliding operation to change the posture of the test tray 110. In one or more embodiments, since the posture of the test tray 110 is changed from the horizontal state to the vertical state in the loader unit 20A, it is possible to supply the test tray 110 to the tray transport unit 50 in the vertical state.

The horizontal moving device 45 is a device that supplies the test tray 110 to the vertical transport device 46 by moving the test tray 110 vertically erected by the sliding devices 43 and 44 described above in the horizontal direction (Y direction). The horizontal moving device 45 includes clamps 451 and air cylinders 452. Each of the clamps 451 is capable of moving forward and backward along the X direction by an actuator such as an air cylinder. The clamps 451 are capable contacting a pair of long sides of the test tray 110 and holding the test tray 110 from both sides. Each of the air cylinders 452 is capable of moving the clamp 451 forward and backward along the Y direction. Instead of the air cylinder 452, other actuators such as a motor and a ball screw mechanism may be used.

The vertical transport device 46 is a device that supplies a test tray 110 changed into a vertical state to the tray transport unit 50 and is disposed above the tray transport unit 50. The vertical transport device 46 includes a pair of vertical rails 461, sliders 462, air cylinders 463, and insertion pieces 464. The configuration of the vertical transport device 46 is not particularly limited as long as it can convey the test tray 110 in the vertical direction.

A pair of vertical rails 461 are disposed along the Z direction and are substantially parallel to each other at an interval wider than the width of the test tray 110. Each of the slider 462 is slidably provided on the vertical rail 461 and is capable of moving along the Z direction on the vertical rail 461 by an actuator such as an air cylinder (not shown) in particular.

The air cylinder 463 is provided on the slider 462, and a cylindrical insertion piece 464 is attached to the distal end of the movable shaft of the air cylinder 463. The air cylinders 463 are provided on the slider 462 so that the insertion pieces 464 face each other. The air cylinder 463 is capable of moving the insertion piece 464 forward and backward along the X direction so that the insertion pieces 464 approach to and separate from each other by driving of the air cylinders 463. Instead of the air cylinder 463, other actuators such as a motor and a ball screw mechanism may be used.

When the test tray 110 is supplied to the vertical transport device 46 by the horizontal moving device 45 in a state where the slider 462 is positioned at the upper end of the vertical rail 461, the vertical transport device 46 holds the test tray 110 by moving the movable axis of the air cylinder 463 forward and inserting the insertion pieces 464 into the pair of recesses 112 of the first side 110b side of the test tray 110. Next, the sliders 462 descend on the vertical rail 461, thereby the test tray 110 is conveyed in a vertical state and is supplied to the tray transport unit 50. In this manner, by supplying the test tray 110 vertically from the loader unit 20A to the tray transport unit 50, it is possible to reduce the area occupied by the handler 10.

At this time, in one or more embodiments, the vertical transport device 46 moves the test tray 110 along the longitudinal direction of the test tray 110. As a result, it is possible to narrow the widths of the loader unit 20A and the unloader unit 20B and it is possible to further reduce the area occupied by the handler 10. Although not particularly limited, the ratio of the total length L in the longitudinal direction of the test tray 110 with respect to the size W in the width direction of the test tray 110 is preferably 105% or more (L/W≥105%), and the ratio is more preferably 120% or more (L/W≥120%).

The unloader part 40B has the same configuration as the loader part 40A and, although not particularly shown, includes a pick-and-place device 41, a posture changing device 42, and a vertical transport device 46. In this unloader part 40B, the operation opposite to the operation of the loader part 40A is performed.

That is, the test tray 110 on which the tested DUTs 200 are mounted is supplied from the tray transport unit 50 to the unloader part 40B by the vertical transport device 46, and the posture of the test tray 110 is changed from a vertical state to a horizontal state by the posture changing device 42. Next, the tested DUTs 200 are transferred from the test tray 110 to the customer tray 100 by a pick-and-place device 41. At this time, the DUTs 200 are classified according to the test result by transferring the DUTs 200 from the test tray 110 to the customer tray 100 according to the test result by the pick and place device 41.

Furthermore, as shown in FIG. 7, the spaces of the loader part 40A and the unloader part 40B of one or more embodiments are connected to each other through an openings 231 respectively formed in the cases 23 of the loader unit 20A and the unloader unit 20B. The empty test tray 110 can be moved from the unloader part 40B to the loader part 40A by the tray return devices 47 provided in each of the loader part 40A and the unloader part 40B. In order to facilitate understanding of the tray return device 47, the posture changing device 42 is omitted in FIG. 7.

Each of the tray return devices 47 includes a horizontal rail 471 provided below the posture changing device 42, an abutting head 472 that is capable of moving along the X direction on the horizontal rail 471, and a pair of bearing rails 473 that slidably hold both ends of the test tray 110. In the unloader part 40B, the abutting head 472 slides on the horizontal rail 471 and abuts and presses against the test tray 110, thereby the test tray 110 slides on the bearing rail 473 and moves along the X direction to move from the unloader part 40B to the loader part 40A through the openings 231 of the cases 23. As a result, it is possible to return the empty test tray 110 from the unloader unit 20B to the loader unit 20A and circulate the test tray 110 in the handler 10.

The horizontal rail 471 and the abutting head 472 can be raised and lowered by an actuator such as an air cylinder (not shown in particular) so as not to interfere with the posture changing device 42 or the like when not in use. Similarly, the bearing rail 473 can be raised and lowered by another actuator.

Figure 8:
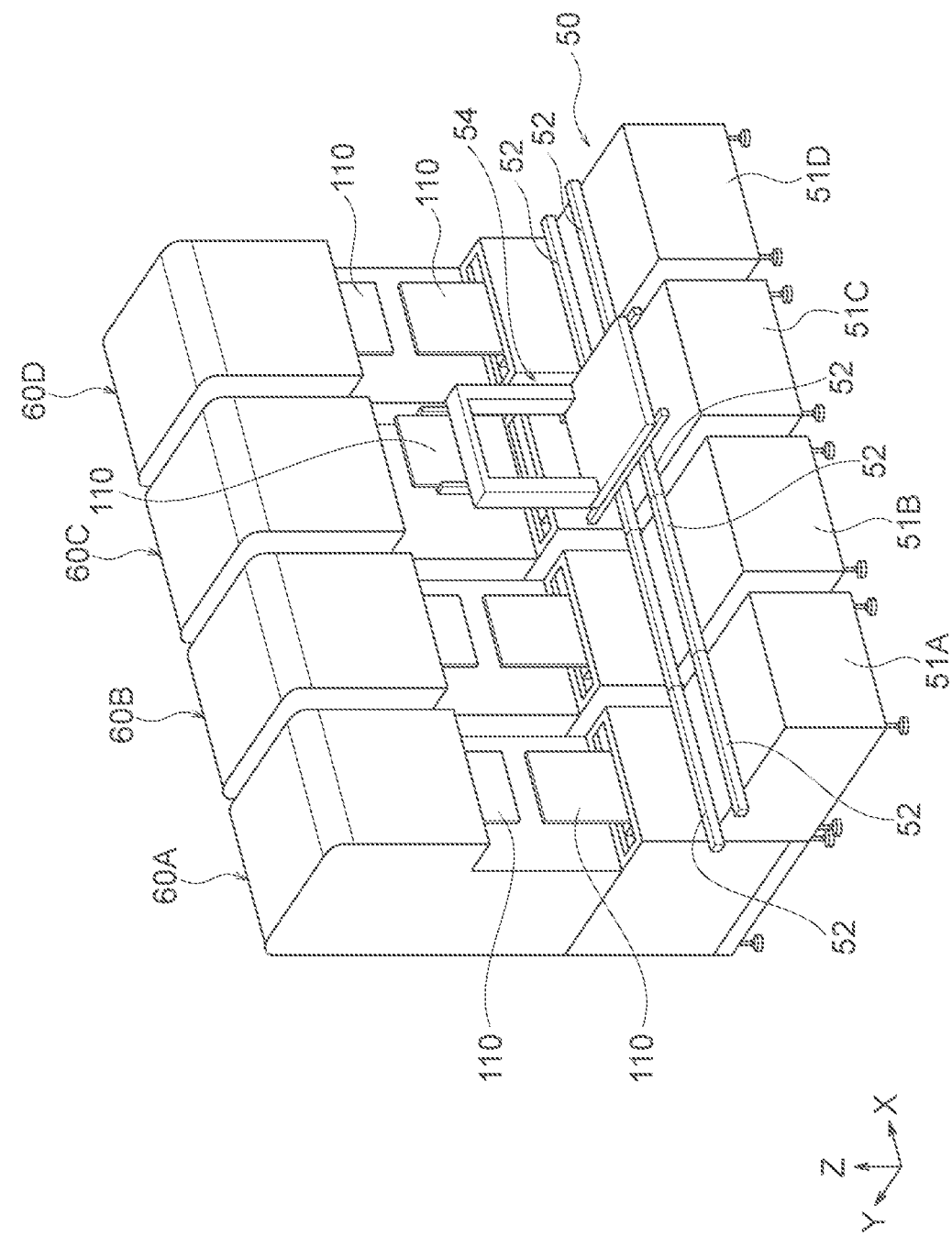
FIG. 8 is a perspective view showing a tray transport unit and contact units in one or more embodiments of the present invention.
Figure 9:
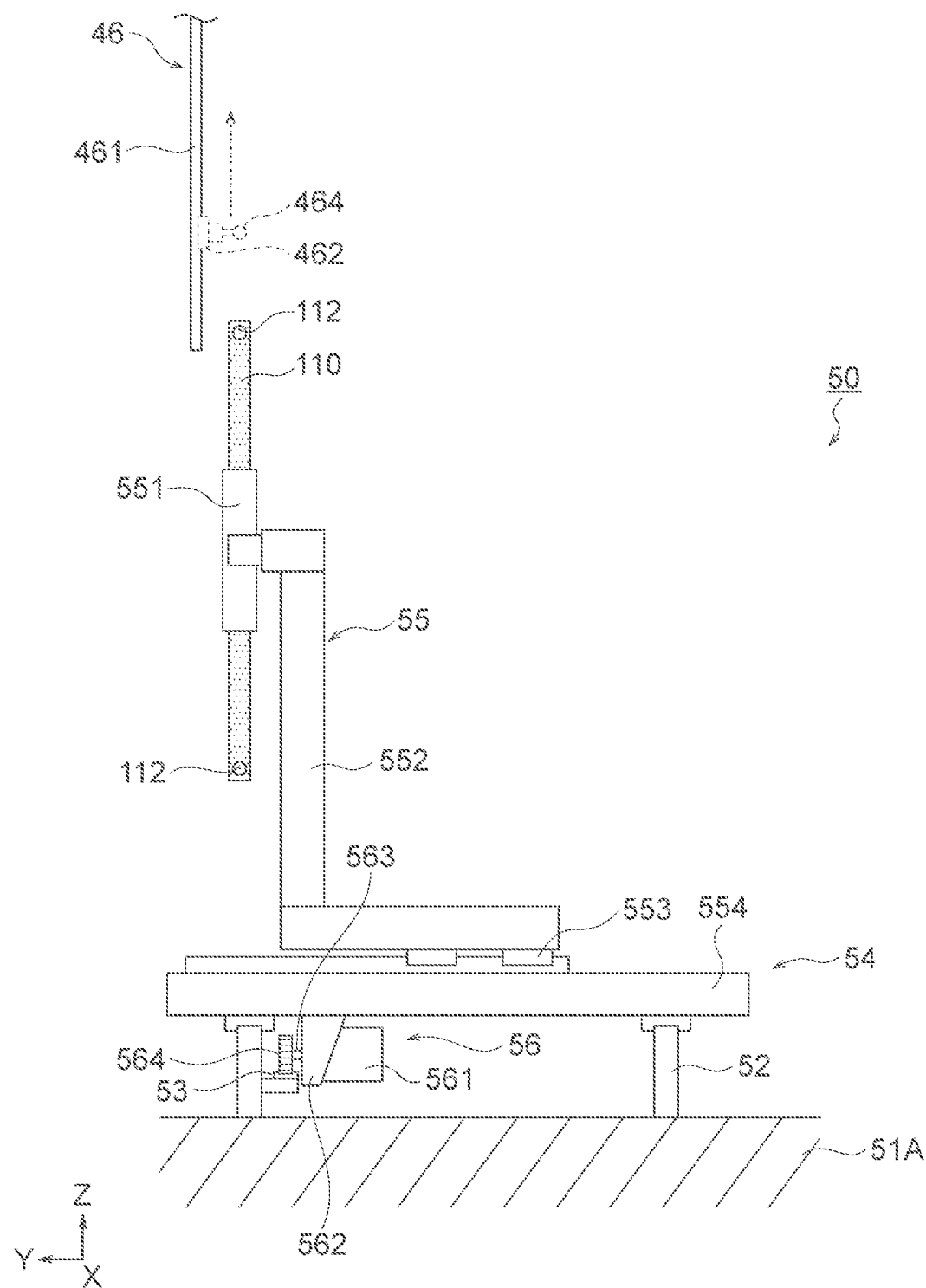
FIG. 9 is a side view showing a tray transport unit in one or more embodiments of the present invention.
Figure 10:
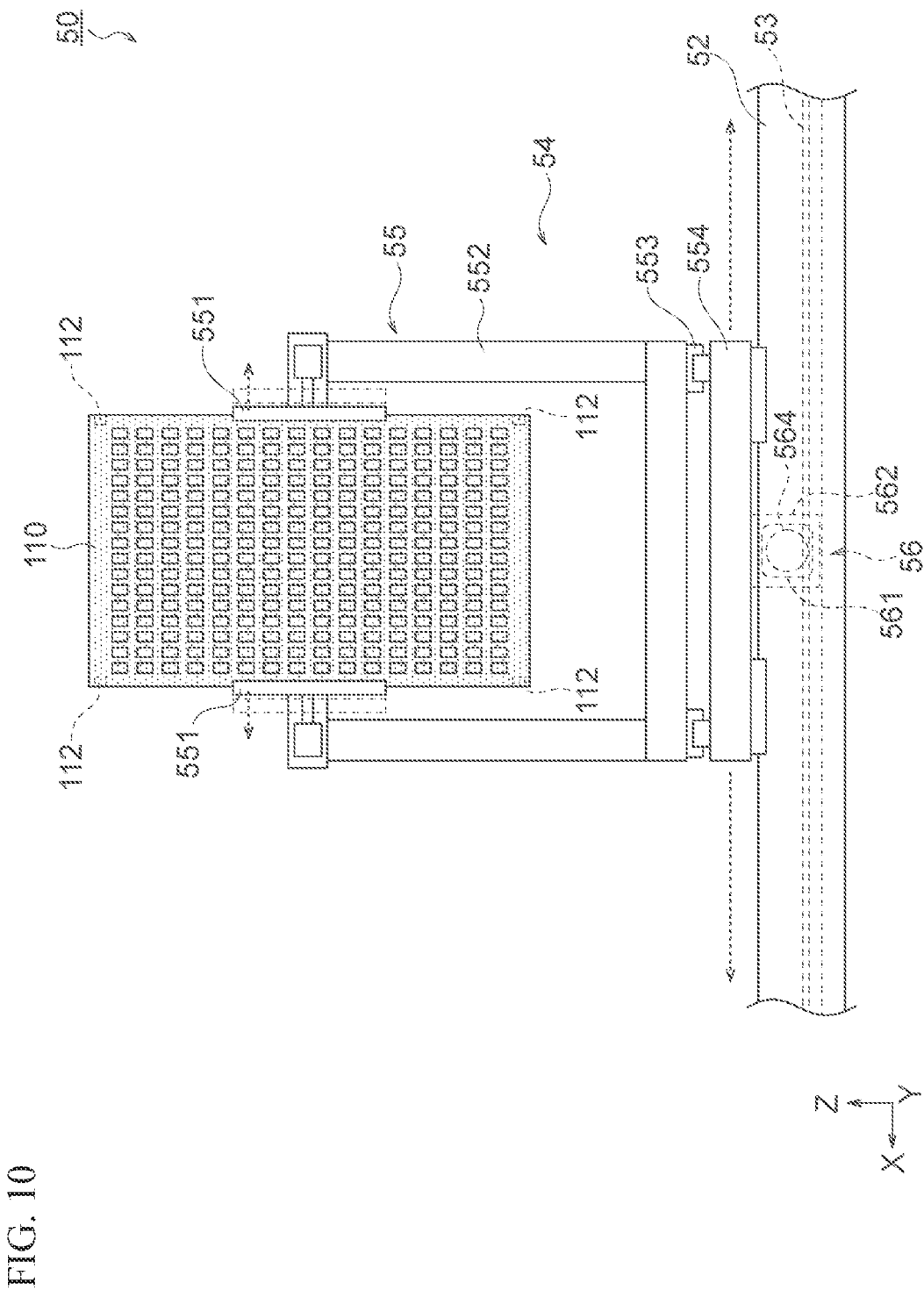
FIG. 10 is a front view showing a tray transport unit in one or more embodiments of the present invention.

FIG. 8 is a perspective view showing a tray transport unit and contact units in one or more embodiments. FIG. 9 is a side view showing a tray transport unit in one or more embodiments. FIG. 10 is a front view showing a tray transport unit in one or more embodiments.

The tray transport unit 50 is a unit that transports the test tray 110 between the contact unit 60A to 60D and the transfer unit 20A and 20B. The tray transport unit 50 moves the test tray 110 in a vertical state along a direction substantially parallel to the main surface 110a of the test tray 110. In this manner, the tray transport unit 50 transports the test tray 110 in the vertical state, thereby it is possible to reduce the area occupied by the handler 10.

As shown in FIG. 8, the tray transport unit 50 includes device frames 51A to 51D on each of which the rails 52 are laid, and a moving (or movable) part 54 capable of moving on the rails 52 in the X direction.

The box-shaped device frames 51A to 51D are arranged along the X direction so as to face each of the four contact units 60A to 60D. The four device frames 51A to 51D have the same construction. As described above, the pair of rails 52 extending along the X direction is laid on each of the device frame 51A to 51D.

The rails 52 of the device frame 51A to 51D adjacent to each other are detachably connected by a coupler (connector) not shown in particular, and the moving part 54 is capable of facing all the contact unit 60A to 60D by moving on the rail 52. Further, as shown in FIGS. 9 and 10, each of the device frames 51A to 51D includes a rack gear 53 provided along the rail 52. The rack gear 53 extends along the X direction and is disposed substantially parallel to the rail 52.

As shown in FIGS. 9 and 10, the moving part 54 includes a tray holding device 55 that holds the test tray 110 in a vertical state, and a driving device 56 that moves the tray holding device 55 on the rail 52. The configuration of the tray holding device 55 is not particularly limited as long as it is capable of holding the test tray 110 in a vertical state and moving the test tray 110 forward and backward in the Y direction.

The tray holding device 55 includes clamps 551, support frames 552, a horizontal moving part 553, and a support plate 554. Each of the clamps 551 is capable of moving forward and backward along the X direction by an actuator such as an air cylinder. The clamps 551 are capable of contacting a pair of long sides of the test tray 110 and holding the test tray 110 from both sides. Each of the clamp 551 is supported by the L-shaped support frame 552 and is disposed at a height facing the test tray 110 positioned at the lowermost point of the vertical transport device 46 of the transfer units 20A and 20B and facing the access section 61 (described later) of the contact units 60A to 60D.

The support frames 552 are supported by the horizontal moving part 553. Further, the horizontal moving part 553 is supported by the support plate 554 movably along the Y direction, and the horizontal moving part 553 is capable of moving along the Y direction by an actuator such as an air cylinder (not shown in particular). Thereby, the tray holding device 55 can move the test tray 110 held in the vertical state forward and backward along the normal direction (Y direction) of the test tray 110. Then, the support plate 554 is capable of moving along the X direction on the rails 52 described above.

The driving device 56 includes a rotary motor 561 provided on the support plate 554 of the tray holding device 55. The rotary motor 561 is fixed to the lower surface of the support plate 554 via a flange 562. The pinion gear 564 is attached to the rotary shaft 563 of the rotary motor 561. The pinion gear 564 is engaged with the above-described rack gears 53 provided on the device frames 51A to 51D. Therefore, it is possible to move the moving part 54 on the rails 52 by driving the rotary motor 561.

In this way, the driving device 56 is included in the moving part 54 rather than the rails 52 of the device frames 51A to 51D side in one or more embodiments. Therefore, since the device frame 51A to 51D having the rails 52 may be just added (or removed) in association with the addition (or removal) of the contact unit and it is not necessary to add a change to the driving device 56, it is possible to easily achieve the addition and removal of the tray transport unit 50.

When the test tray 110 on which the untested DUTs 200 are mounted is supplied by the vertical transport device 46 of the loader unit 20A, the tray transport unit 50 moves the tray holding device 55 along the X direction on the rail 52 by the driving device 56 so that the tray holding device 55 faces the test tray 110. Then, the horizontal moving part 553 moves the support frames 552 forward, and the clamps 551 hold the test tray 110 in a vertical state.

Next, after the horizontal moving part 553 moves the support frames 552 backward, the test tray 110 is transported in a vertical state by moving the tray holding device 55 along the X direction by the driving device 56. Then, when the test tray 110 faces the target contact unit 60A to 60D, the horizontally moving part 553 moves the support frames 552 forward to supply the test tray 110 to the target contact unit 60A to 60D.

On the other hand, when the test tray 110 on which the tested DUTs 200 are mounted is carried out from the contact unit 60A to 60D, the tray transport unit 50 moves the tray holding device 55 along the X direction on the rails 52 by the driving device 56 so that the tray holding device 55 faces the test tray 110. Then, the horizontal moving part 553 moves the support frames 552 forward, and the clamps 551 hold the test tray 110 in a vertical state.

Next, after the horizontal moving part 553 moves the support frames 552 backward, the test tray 110 is transported in a vertical state by moving the tray holding device 55 along the X direction by the driving device 56. Then, when the test tray 110 faces the vertical transport device 46 of the unloader unit 20B, the horizontal moving part 553 moves the support frames 552 forward to carry the test tray 110 to the unloader unit 20B.

In this way, since the tray transport unit 50 transports the test tray 110 in the vertical state, it is possible to reduce the area occupied by the handler 10 in one or more embodiments.

Figure 11:
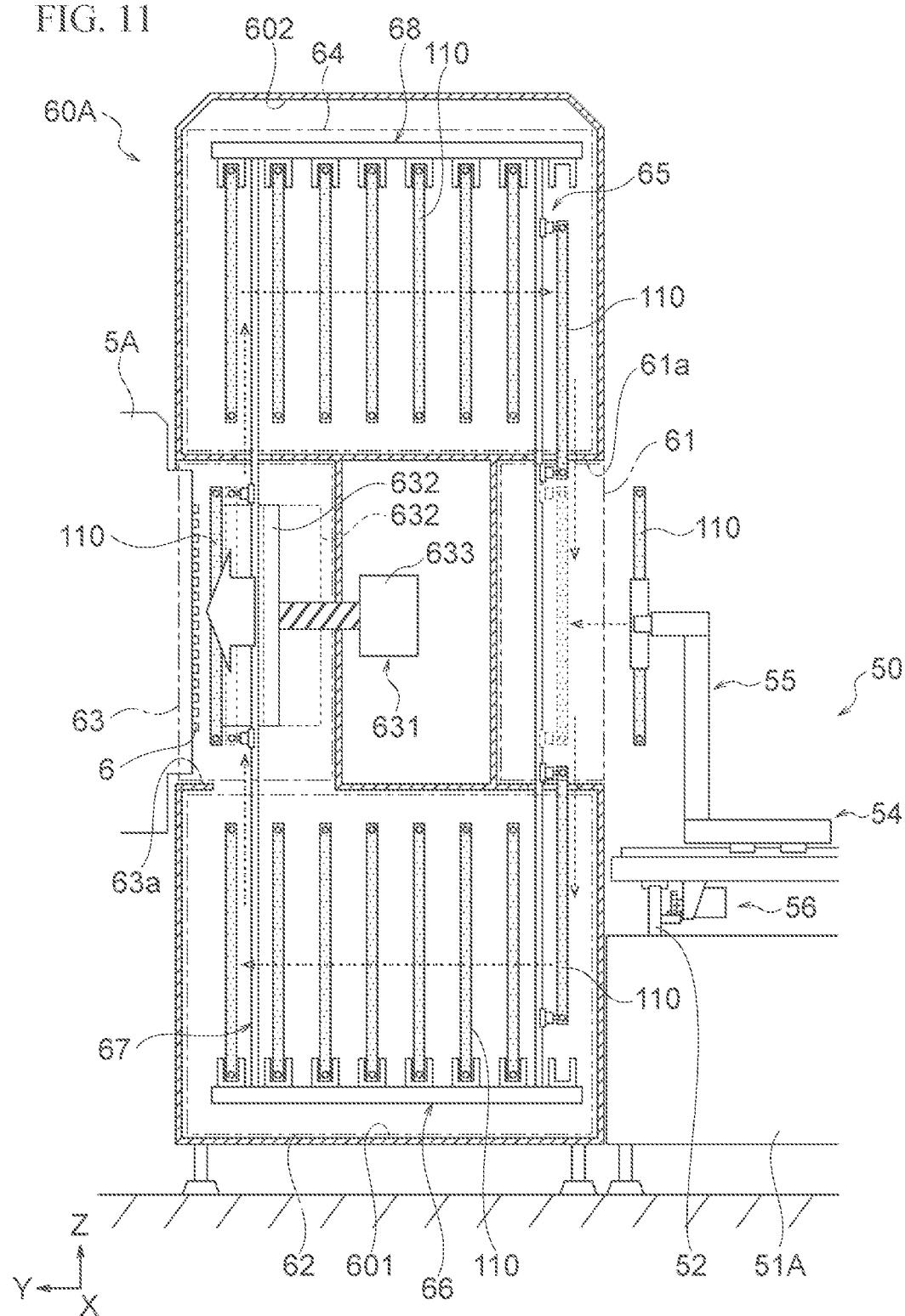
FIG. 11 is a cross-sectional view showing an internal structure of the contact unit in one or more embodiments of the present invention.

FIG. 11 is a cross-sectional view showing an internal structure of the contact unit in one or more embodiments. Since the four contact units 60A to 60D have the same structure, the configuration of the contact unit 60A will be described in detail below, and the description of the configuration of the other contact units 60B to 60D will be omitted.

As shown in FIG. 11, the contact unit 60A includes an access section (or portion) 61, a heat applying section 62 (or portion), a pressing section (or portion) 63, and a heat removing section (or portion) 64.

In the access section 61, the test tray 110 is moved in and out of the contact unit 60A by the tray transport unit 50. In the heat applying section 62, a predetermined thermal stress is applied to the untested DUT 200 mounted on the test tray 110 supplied via the access section 61. In the pressing section 63, the DUT 200 is pressed to the socket 6 of the test head 5A, and the test of the DUT 200 is performed by the tester 7. In the heat removing section 64, thermal stress is removed from the tested DUT 200.

The heat applying section 62 and the pressing section 63 are provided in the first chamber 601 composed of a thermostatic chamber. A temperature adjusting device 621A (see FIG. 3) is connected to the first chamber 601. The temperature adjusting device 621A includes a heating device and a cooling device, and the temperature adjusting device 621A is capable of applying a high-temperature or low-temperature thermal stress to the DUT 200 located in the heat applying section 62 and the pressing section 63 by adjusting the atmospheric temperature in the first chamber 601. Although not particularly limited, as a specific example of the heating device of the temperature adjusting device 621A, for example, a heater or a hot air supplying device can be exemplified. As a specific example of the cooling device of the temperature adjusting device 621A, for example, a refrigerant supply device that supplies liquid nitrogen can be exemplified.

As described above, since the temperature adjusting devices 621A to 621D are individually connected to the four contact units 60A to 60D, the contact unit (e.g., the contact unit 60A) can adjust the temperature environment in the first chamber 601 independently from the other contact units (e.g., the contact units 60B to 60D). Each of the temperature adjusting devices 621B to 621D has the same configuration as the temperature adjusting device 621A described above.

As described above, the opening 63a is formed in the first chamber 601. A portion of the test head 5A enters the pressing section 63 through the opening 63a with the sockets 6 oriented in the horizontal direction. The pressing section 63 includes a pressing device 631 that is provided so as to face the sockets 6.

The pressing device 631 includes a pusher 632 that contacts the DUTs 200 held on the test tray 110, and an actuator 633 that moves the pusher 632 forward and backward along the Y direction. Although not particularly limited, as an example of the actuator 633a, a motor or the like having a ball screw mechanism can be exemplified. The pressing device 631 is capable of pressing the DUTs 200 to the sockets 6 in a state where the DUTs 200 are mounted on the test trays 110 in a vertical state by pressing the DUTs 200 in the horizontal direction.

In one or more embodiments, since each of the four contact units 60A to 60D individually includes the pressing device 631, the contact unit (e.g., the contact units 60A) can press DUT200 to the sockets 6 independently from the other contact units (e.g., the contact units 60B to 60D).

On the other hand, the heat removing section 64 is provided in the second chamber 602 that is independent from the first chamber 601, and the heat removing section 64 removes the heat stress from the DUT 200 by exposing the DUT 200 to the outside air. Therefore, a temperature adjusting device that is capable of cooling is not connected to the second chamber 602. The second chamber 602 may have a heating device such as a heater or a blower.

In one or more embodiments, the heat applying section 62, the access section 61, and the heat removing section 64 are arranged along the vertical direction. Further, the heat applying section 62, the pressing section 63, and the heat removing section 64 are arranged along the vertical direction. In particular, the heat applying section 62 is disposed below the access section 61 and is disposed below the pressing section 63. On the other hand, the heat removing section 64 is disposed above the access section 61 and is disposed above the pressing section 63. Therefore, the access section 61 and the pressing section 63 are disposed between the heat applying section 62 and the heat removing section 64 and faces each other. It is possible to narrow the contact units 60A to 60D and reduce the area occupied by the handler 10 by employing such an arrangement.

Further, in one or more embodiments, the heat-applying section 62 that is capable of cooling the DUT 200 is disposed at the lowermost portion of the contact unit 60A. Thus, it is possible to restrain the cold air from moving from the heat applying section 62 to the heat removing section 64, it is possible to efficiently apply a thermal stress to the DUT 200 in the heat applying section 62. Further, since it is not necessary to route the pipe of the temperature adjusting device 621A to the upper portion of the contact unit 60A, it is also possible to simplify the structure of the handler 10.

Then, the contact unit 60A includes a first vertical conveying device 65, a first horizontal conveying device 66, a second vertical conveying device 67, and a second horizontal conveying device 68.

The first vertical conveying device 65 corresponds to an example of the "seventh tray moving device" in one or more embodiments of the present invention, the first horizontal conveying device 66 corresponds to an example of the "fifth tray moving device" in one or more embodiments of the present invention, the second vertical conveying device 67 corresponds to an example of the "fourth tray moving device" in one or more embodiments of the present invention, and the second horizontal conveying device 68 corresponds to an example of the "sixth tray moving device" in one or more embodiments of the present invention.

The first vertical conveying device 65 moves the test tray 110 on which the untested DUTs 200 are mounted from the access section 61 to the heat applying section 62 and moves the test tray 110 on which the tested DUTs 200 are mounted from the heat removing section 64 to the access section 61. The first vertical conveying device 65 conveys the test tray 110 in the −Z direction in a vertical state.

At this time, the first vertical conveying device 65 moves the test tray 110 along the longitudinal direction of the test tray 110. As a result, it is possible to narrow the contact units 60A to 60D and further reduce the area occupied by the handler 10.

An opening 61a is formed in the access section 61, and the tray transport unit 50 can deliver and receive the test tray 110 to and from the first vertical conveying device 65 through the opening 61a. When the test tray 110 on which the untested DUTs 200 are mounted is supplied from the tray transport unit 50 to the access section 61 through the opening 61a, the first vertical conveying device 65 moves the test tray 110 in the −Z direction to supply the test tray 100 to the heat applying section 62.

The first horizontal conveying device 66 is provided in the heat applying section 62, and the first horizontal conveying device 66 receives the test tray 110 on which the untested DUTs 200 are mounted from the first vertical conveying device 65 and moves the test tray 110 in the +Y direction. The first horizontal conveying device 66 moves the test tray 110 along the normal direction of the test tray 110 in a vertical state.

At this time, the first horizontal conveying device 66 moves the test tray 110 in a state where the longitudinal direction of the test tray 110 is aligned in the vertical direction. As a result, it is possible to narrow the contact units 60A to 60D and further reduce the area occupied by the handler 10.

While the test tray 110 passes through the heat applying section 62 by the first horizontal conveying device 66, a predetermined heat stress of high temperature or low temperature is applied to the untested DUTs 200 in a state where the untested DUTs 200 are mounted on the test tray 110. The +Y direction corresponds to an example of the "second direction" in one or more embodiments of the present invention.

The second vertical conveying device 67 moves the test tray 110 on which the untested DUTs 200 are mounted from the heat applying section 62 to the pressing section 63 and moves the test tray 110 on which the tested DUTs 200 are mounted from the pressing section 63 to the heat removing section 64. The second vertical conveying device 67 conveys the test tray 110 in the +Z direction in a vertical state.

At this time, the second vertical conveying device 67 moves the test tray 110 along the longitudinal direction of the test tray 110. As a result, it is possible to narrow the contact units 60A to 60D and further reduce the area occupied by the handler 10.

When the second vertical conveying device 67 receives the test tray 110 on which the untested DUT200 are mounted from the first horizontal conveying device 66, the second vertical conveying device 67 moves the test tray 110 from the heat applying section 62 to the pressing section 63. Then, when the test tray 110 faces the test head 5A, the pressing device 631 moves in the +Y direction to press the DUT 200s to the sockets 6 in a state where the DUTs 200 are mounted on the test tray 110. In this condition, the tests of the DUTs 200 are executed by the tester 7. When the tests are completed, the second vertical conveying device 67 moves the test tray 110 on which the tested DUTs 200 are mounted in the +Z direction to supply the test tray 110 to the heat removing section 64.

The second horizontal conveying device 68 is provided in the heat removing section 64, and the second horizontal conveying device 68 receives the test tray 110 on which the tested DUTs 200 are mounted from the second vertical conveying device 67 and moves the test tray 110 in the −Y direction of FIG. 11. The second horizontal conveying device 68 moves the test tray 110 along the normal direction of the test tray 110 in a vertical state.

At this time, the second horizontal conveying device 68 moves the test tray 110 in a state where the longitudinal direction of the test tray 110 is aligned with the vertical direction. As a result, it is possible to narrow the contact units 60A to 60D and further reduce the area occupied by the handler 10.

While the test tray 110 passes through the heat removing section 64 by the second horizontal conveying device 68, thermal stress is removed from the tested DUTs 200 in a state where the tested DUTs 200 are mounted on the test tray 110. The −Y direction corresponds to an example of the "third direction" in one or more embodiments of the present invention.

When the test tray 110 passes through the heat removing section 64, the first vertical conveying device 65 receives the test tray 110 from the second horizontal conveying device 68 and moves the test tray 110 in the −Z direction to convey to the access section 61. The test tray 110 that is returned to the access section 61 is carried out of the contact unit 60A by the tray transport unit 50 through the opening 61a.

Hereinafter, an example of configuring handlers having different specifications by adding or removing the contact units and the transfer units will be described with reference to FIGS. 12A to 13B.

Figure 12A:
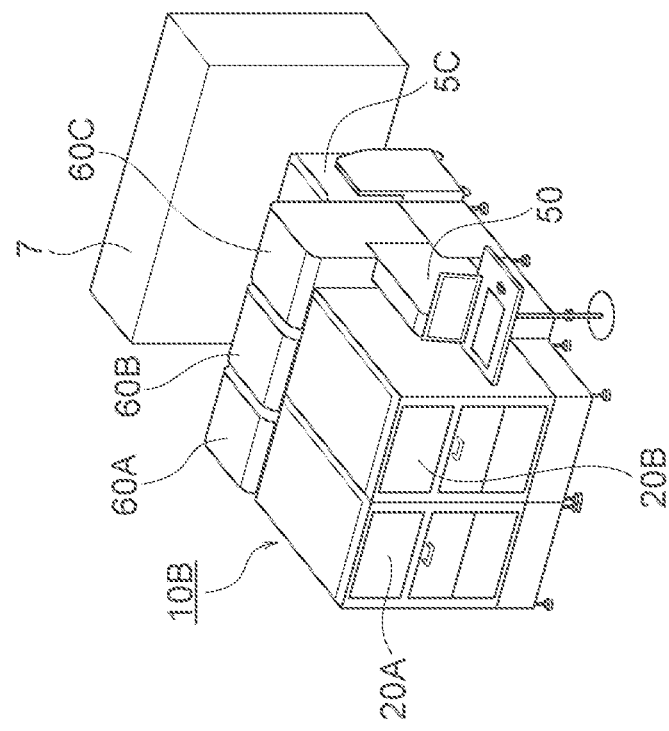
FIG. 12A is a diagram showing a handler configured to correspond to 1024 simultaneous measurement number.
Figure 12B:
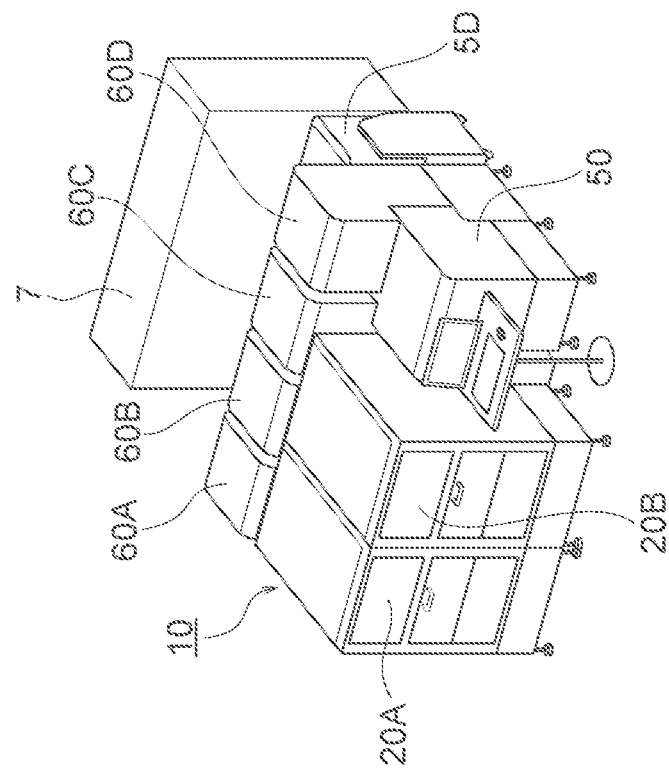
FIG. 12B is a diagram showing a handler configured to correspond to 768 simultaneous measurement number.
Figure 13A:
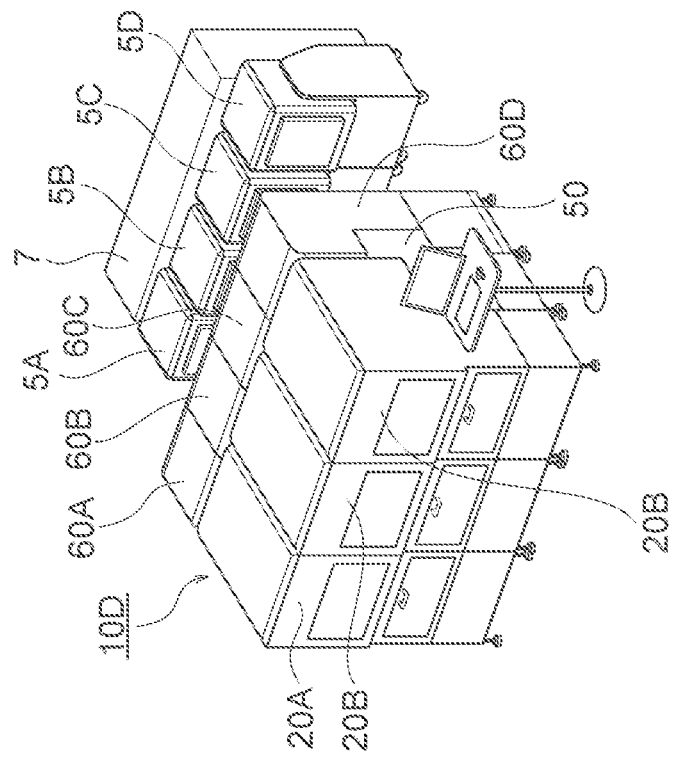
FIG. 13A is a diagram showing a handler including two loader units.
Figure 13B:
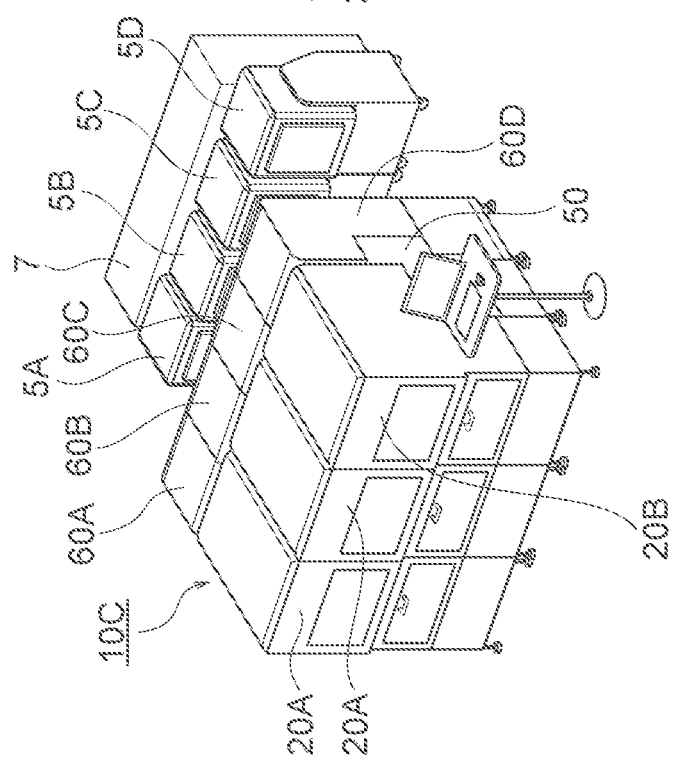
FIG. 13B is a diagram showing a handler including two unloader units.

FIG. 12 A is a diagram showing a handler configured to correspond to 1024 simultaneous measurement number, and FIG. 12B is a diagram showing a handler configured to correspond to 768 simultaneous measurement number. FIG. 13A is a diagram showing a handler including two loader units, and FIG. 13B is a diagram showing a handler including two unloader units. FIG. 13A and FIG. 13B show a state in which the test head 5A to 5D is removed from the contact units 60A to 60D.

In the above-described embodiments, a handler 10 configured to correspond to the tester 7 whose simultaneous measurement number is 1024 has been described. As shown in FIG. 12A, the handler 10 includes four contact units 60A to 60D in order to correspond to four test heads 5A to 5D connected to the tester 7.

On the other hand, when dealing with the tester 7B whose simultaneous measurement number smaller than the simultaneous measurement number of the tester 7, a handler 10B having specifications different from those of the handler 10 described above is configured. For example, the simultaneous measurement number of the tester 7B is 768, and three test heads 5A to 5C are connected to the tester 7B. The handler 10B corresponding to the tester 7B has a configuration in which the contact unit 60D is removed from the handler 10. That is, the handler 10B includes three contact units 60A to 60C.

The simultaneous measurement number of the tester is not particularly limited to the above, and may be, for example, 256 or 512. Although not particularly limited, when the simultaneous measurement number of the tester is 256 and one test head is connected to the tester, a handler having only one contact unit may be configured. On the other hand, when the simultaneous measurement number of the tester is 512 and two test heads are connected to the tester, a handler having two contact units may be configured.

Further, although not shown in particular, when dealing with the tester of the simultaneous measurement number larger than the simultaneous measurement number of the tester 7, a handler to which the contact unit is added in accordance with the increased number of the test head is configured.

Further, for example, when the test time of the DUT 200 is short, a handler 10C as shown in FIG. 13A may be configured. The handler 10C is different from the handler 10 described above in that the handler 10C includes two loader unit 20A, but the rest of the configuration of the handler 10C is similar to the handler 10.

Further, for example, when the number of test results to be classified is large, a handler 10D as shown in FIG. 13B may be configured. The handler 10D is different from the handler 10 described above in that the handler 10D includes two unloader unit 20B, but the rest of the configuration of the handler 10D is similar to the handler 10.

As described above, in one or more embodiments, the handler 10 is configured so that the transfer units 20 and 20B and the contact units 60A to 60D can be added to or removed from the handler 10. As a result, since it is possible to combine the optimum units for the user's requirements to configure the handler 10, it is possible to optimize the specification of the handler 10 at a low cost in response to the user's requirements.

Further, since the handler 10 is configured so that the transfer units 20A and 20B and the contact units 60A to 60D can be added to or removed from the handler 10, it is possible to solve the abnormality by replacing the unit in which the abnormality has occurred with a new unit, and it is possible to improve the maintainability of the handler 10.

Further, in one or more embodiments, since the handler 10 is configured so that the contact units 60A to 60D can be added to or removed from the handler 10, it is possible to optimize the number of contact units 60A to 60D according to the of simultaneous measurement number, and it is possible to reduce the space occupied by the handler 10.

In addition, since the conventional handler is not unitized, the adjustment of the apparatus can be performed only after the entire apparatus is assembled in the manufacturing process of the handler. On the other hand, in one or more embodiments, since the handler is unitized, it is possible to carry out the adjustments for each unit in parallel and it is possible to greatly shorten the manufacturing time of the handler.

In one or more embodiments, the handler 10 includes a plurality of contact units 60A to 60D, and each of the contact units 60A to 60D can adjust the temperature of the DUT 200 independently from the other contact units 60A to 60D and press the DUT 200 to the socket 6 of the test head 5A to 5D independently from the other contact units 60A to 60D.

Therefore, it is possible to divide the number of the simultaneous measurements into a plurality of units, and the plurality of contact units 60A to 60D can individually execute the tests for each of the division units. Accordingly, the number of the DUTs mounted per one test tray in the loader unit 20A is reduced, and the feeding operation to the individual contact units 60A to 60D (transfer operation to the test tray 110) is shortened, and as a result, it is possible to shorten the standby time of the contact units 60A to 60D. Further, since it is possible to reduce the probability of failure that occurs in the contact units 60A to 60 by dividing the number of simultaneous measurements into a plurality of units, it is possible to shorten the stop time of the handler 10. Therefore, in one or more embodiments, it is possible to improve the operation rate of the handler 10.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, the handler 10 is configured so that the transfer unit 20A,20B can be added to or removed from the handler 10 and the contact unit 60A~60D can be added or to or removed from the handler 10 in the above-described embodiments, but the handler is not particularly limited thereto. For example, the handler 10 may be configured so that one of the transfer unit 20A and 20B or the contact unit 60A to 60D is added to or removed from the handler 10.

Although the tray transport unit 50 moves the test tray 110 in a vertical state in the above-described embodiments, the posture of the test tray 110 moved by the tray transport unit 50 is not particularly limited thereto.

For example, the tray transport unit 50 may move the test tray 110 in a horizontal state. More specifically, the tray transport unit 50 may move the test tray 110 between the transfer units 20A and 20B and the contact units 60A to 60D in a state where the main surface 110a of the test tray 110 is substantially parallel to the horizontal direction.

In this case, the tray transfer units 20A and 20B do not include the posture changing device 42, the vertical transport device 46 may deliver and receive the test tray 110 to and from the tray transport unit 50 in a horizontal state.

Further, in the above-described cases, the conveying devices 65 to 68 of the contact unit 60A to 60D convey the test tray 110 in a horizontal state, and the pressing device 631 of the contact unit 60A to 60D presses DUT200 vertically toward the socket 6 in a state where the test tray 110 is horizontally.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Electronic component testing apparatus
5A to 5D . . . Test head
10, 10B to 10D . . . Handler
20A, 20B . . . Loader unit, Unloader unit
30 . . . Tray storage part
31 . . . Stocker
311 . . . Elevator
32 . . . Tray transfer arm
33 . . . Tray return arm
40A, 40B . . . Loader part, Unloader part
42 . . . Posture changing device
43 . . . Horizontal sliding device
44 . . . Vertical sliding device
46 . . . Vertical transport device
50 . . . Tray transport unit
55 . . . Tray holding device 60A-60D ... Contact unit
100 ... Customer tray
110 ... Test tray
110b ... First side
110b ... Second side
200 ... DUT

What is claimed is:

1. An electronic component handling apparatus that handles a device under test (DUT), the electronic component handling apparatus comprising:
multiple transfer units that each comprise a DUT transfer part that mounts the DUT on a first tray or that removes the DUT from the first tray;
multiple contact units that each press the DUT mounted on the first tray against a socket disposed on a test head connected to a tester; and
a tray transporter that transports the first tray between the multiple contact units and the multiple transfer units, wherein
at least one of the multiple transfer units is removably disposed on the electronic component handling apparatus.

2. The electronic component handling apparatus according to claim 1, wherein the DUT transfer part is disposed above the tray transporter.

3. The electronic component handling apparatus according to claim 1, wherein
the multiple contact units are arranged along a first direction parallel to a horizontal direction of the electronic component handling apparatus,
the multiple transfer units are arranged along the first direction, and
the tray transporter transports the first tray along the first direction.

4. The electronic component handling apparatus according to claim 1, wherein
the DUT transfer part comprises a first tray moving device that delivers and receives the first tray in a vertical state to and from the tray transporter.

5. The electronic component handling apparatus according to claim 4, wherein
the first tray moving device moves the first tray along a longitudinal direction of the first tray.

6. The electronic component handling apparatus according to claim 4, wherein
the tray transporter comprises a tray holding device that holds the first tray in the vertical state.

7. The electronic component handling apparatus according to claim 1, wherein
the DUT transfer part comprises a posture changing device that changes a posture of the first tray between a horizontal state and a vertical state.

8. The electronic component handling apparatus according to claim 1,
each of the multiple transfer units comprises a tray storage that stores a second tray, and
the DUT transfer part transfers the DUT between the first tray and the second tray.

9. The electronic component handling apparatus according to claim 8, wherein
the DUT transfer part is disposed above the tray storage.

10. The electronic component handling apparatus according to claim 8, wherein
the tray storage comprises:
first holding devices that hold the second tray; and
a second tray moving device that moves the second tray between the first holding devices.

11. The electronic component handling apparatus according to claim 1, wherein
the multiple transfer units include:
a loader unit that comprises a loader part that transfers an untested DUT from a second tray to the first tray; and
an unloader unit that comprises an unloader part that transfers a tested DUT from the first tray to the second tray.

12. The electronic component handling apparatus according to claim 11, wherein
the number of loader units included in the electronic component handling apparatus is different from the number of unloader units included in the electronic component handling apparatus.

13. An electronic component testing apparatus comprising:
an electronic component handling apparatus according to claim 1;
test heads mounted to the multiple contact units; and
a tester electrically connected to the test heads.

14. The electronic component handling apparatus according to claim 1, wherein
at least one of the multiple contact units is removably disposed on the electronic component handling apparatus.

15. An electronic component handling apparatus that handles a device under test (DUT), the electronic component handling apparatus comprising:
transfer units that each comprise a DUT transfer part that mounts the DUT on a first tray or that removes the DUT from the first tray;
contact units that each press the DUT mounted on the first tray against a socket disposed on a test head connected to a tester; and
a tray transporter that transports the first tray between the contact units and the transfer units, wherein
either or both of (i) at least one of the contact units and (ii) at least one of the transfer units are removably disposed on the electronic component handling apparatus,
the DUT transfer part comprises a posture changing device that changes a posture of the first tray between a horizontal state and a vertical state, and
the posture changing device changes the posture of the first tray by raising or lowering a first side of the first tray while horizontally moving a second side facing the first side of the first tray while maintaining the position of the first side in the horizontal direction.

16. An electronic component handling apparatus that handles a device under test (DUT), the electronic component handling apparatus comprising:
transfer units that each comprise a DUT transfer part that mounts the DUT on a first tray or that removes the DUT from the first tray;
contact units that each press the DUT mounted on the first tray against a socket disposed on a test head connected to a tester; and
a tray transporter that transports the first tray between the contact units and the transfer units, wherein either or both of (i) at least one of the contact units and (ii) at least one of the transfer units are removably disposed on the electronic component handling apparatus,
each of the transfer units comprises a tray storage that stores a second tray,
the DUT transfer part transfers the DUT between the first tray and the second tray,
the tray storage comprises:
first holding devices that hold the second tray; and
a second tray moving device that moves the second tray between the first holding devices, the transfer units adjacent to each other comprise a third tray moving device that is disposed between the tray storages and that moves the second tray, and an operating range of the third tray moving device vertically overlaps operating ranges of the second tray moving devices of the transfer units adjacent to each other.

17. An electronic component testing apparatus comprising:

an electronic component handling apparatus according to claim 15;

test heads mounted to the contact units; and a tester electrically connected to the test heads.

18. An electronic component testing apparatus comprising:

an electronic component handling apparatus according to claim 16;

test heads mounted to the contact units; and a tester electrically connected to the test heads.

* * * * *